(12) United States Patent
Sato et al.

(10) Patent No.: US 11,122,687 B2
(45) Date of Patent: Sep. 14, 2021

(54) PRINTED WIRING BOARD

(71) Applicant: Mitsubishi Electric Corporation, Tokyo (JP)

(72) Inventors: Kohei Sato, Tokyo (JP); Shunsuke Sasaki, Tokyo (JP); Yusuke Morimoto, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 16/762,773

(22) PCT Filed: Nov. 30, 2018

(86) PCT No.: PCT/JP2018/044178
§ 371 (c)(1),
(2) Date: May 8, 2020

(87) PCT Pub. No.: WO2019/116930
PCT Pub. Date: Jun. 20, 2019

(65) Prior Publication Data
US 2021/0195744 A1    Jun. 24, 2021

(30) Foreign Application Priority Data
Dec. 11, 2017 (JP) .............................. JP2017-236917

(51) Int. Cl.
*H05K 1/00* (2006.01)
*H05K 1/14* (2006.01)
*H05K 3/36* (2006.01)

(52) U.S. Cl.
CPC .............. *H05K 1/141* (2013.01); *H05K 3/366* (2013.01); *H05K 2201/048* (2013.01); *H05K 2201/09009* (2013.01)

(58) Field of Classification Search
USPC ........................................................ 174/250
See application file for complete search history.

(56) References Cited

U.S. PATENT DOCUMENTS

| 2006/0049777 | A1  | 3/2006  | Kumagai et al. |
| 2011/0305852 | A1* | 12/2011 | Sugaya ................ H05K 3/0044 428/33 |
| 2012/0212920 | A1* | 8/2012  | Schreffler ............ H01R 12/737 361/803 |

FOREIGN PATENT DOCUMENTS

| DE | 202015008007 U1 | 2/2016 |
| JP | S60-113673 U    | 8/1985 |

(Continued)

OTHER PUBLICATIONS

International Search Report (PCT/ISA/210) dated Feb. 19, 2019, by the Japan Patent Office as the International Searching Authority for International Application No. PCT/JP2018/044178.

(Continued)

*Primary Examiner* — Andargie M Aychillhum
(74) *Attorney, Agent, or Firm* — Buchanan Ingersoll & Rooney PC

(57) ABSTRACT

A first substrate has a slit formed therein, passing through the first substrate from one first primary surface to the other first primary surface opposite the one first primary surface, the first substrate including at least one first electrode. A second substrate has one second primary surface and the other second primary surface opposite the one second primary surface, the second substrate: including a support inserted in the slit so as to intersect with the first substrate; and having at least one second electrode on the support. The first electrode and the second electrode are bonded by a solder. A dimension of the slit in the longitudinal direction is greater than the sum of a design dimension of the support in the longitudinal direction, a maximum design dimension tolerance of the support in the longitudinal direction, and a maximum design dimension tolerance of the slit in the longitudinal direction.

7 Claims, 19 Drawing Sheets

(56) References Cited

FOREIGN PATENT DOCUMENTS

| | | |
|---|---|---|
| JP | H07-7166 U | 1/1995 |
| JP | 2002111161 A | 4/2002 |
| JP | 2004153178 A | 5/2004 |
| JP | 2006237176 A | 9/2006 |
| JP | 2008211117 A | 9/2008 |
| JP | 2013040671 A | 2/2013 |
| JP | 2014236091 A | 12/2014 |
| JP | 2018081962 A | 5/2018 |

OTHER PUBLICATIONS

Written Opinion (PCT/ISA/237) dated Feb. 19, 2019, by the Japan Patent Office as the International Searching Authority for International Application No. PCT/JP2018/044178.

Office Action dated May 18, 2021 issued in corresponding Japanese Patent Application No. 2019-559550, with English translation (8 pages).

* cited by examiner

PRINTED WIRING BOARD

TECHNICAL FIELD

The present invention relates to a printed wiring board, and, more particularly, to a printed wiring board which includes a parent substrate as a first substrate, a standing substrate, as a second substrate, intersecting with the first substrate.

BACKGROUND ART

For example, Japanese Patent Laying-Open No. 2004-153178 (PTL 1) discloses an electronic device having multiple printed wiring boards, in which a standing substrate, having a primary surface extending along the vertical direction, is mounted on a parent substrate having a primary surface extending along the horizontal direction. In Japanese Patent Laying-Open No. 2004-153178, the standing substrate is inserted in a slit provided in the parent substrate, and electrodes on the standing substrate are soldered to electrodes on the parent substrate.

CITATION LIST

Patent Literature

PTL 1: Japanese Patent Laying-Open No. 2004-153178

SUMMARY OF INVENTION

Technical Problem

The parent substrate and the standing substrate included in the electronic device disclosed in Japanese Patent Laying-Open No. 2004-153178 expand or contract in accordance with a temperature in use environment. Since the standing substrate is inserted in the slit in the parent substrate and they are solder bonded together as described above, strain is caused at the solder joint between the parent substrate and the standing substrate as the substrate material expands and contracts. If the substrate material repeatedly expands and contracts, what is known as a temperature cycling condition results. In the electronic device disclosed in Japanese Patent Laying-Open No. 2004-153178, the slit in the parent substrate has generally the same dimension as a support for the standing substrate inserted in the slit. Therefore, as a temperature cycling condition is introduced, strain is constantly applied to the solder joint. This leads to rupture of the solder joint in a short time.

The present invention is made to solve the above problem. An object of the present invention is to provide a printed wiring board which inhibits rupture of a solder joint between a parent substrate and a standing substrate by reducing strain applied to the solder joint in accordance with a temperature change in use environment.

Solution to Problem

A printed wiring board according to the present invention includes a first substrate and a second substrate. The first substrate has a slit and includes at least one the first electrode, the slit being formed in the first substrate and passing through the first substrate from an one first primary surface to an other first primary surface opposite the one first primary surface. The second substrate has one second primary surface and an other second primary surface opposite the one second primary surface and includes a support inserted in the slit so as to intersect with the first substrate and has at least one second electrode on the support, the first electrode on the first substrate and the second electrode being bonded by a solder. A dimension of the slit in a longitudinal direction is greater than a sum of a design dimension of the support in a longitudinal direction, a maximum design dimension tolerance of the support in the longitudinal direction, and a maximum design dimension tolerance of the slit in the longitudinal direction.

Advantageous Effects of Invention

According to the present invention, a longitudinal dimension of the opening of the slit is sufficiently greater than the design dimension of the support in the longitudinal direction. Therefore, even if the substrate material repeatedly expands or contracts due to a temperature change, strain caused at the solder joint can be reduced. Therefore, rupture of the solder joint in a short time can be inhibited.

DESCRIPTION OF EMBODIMENTS

Hereinafter, embodiments according to the present invention will be described, with reference to the accompanying drawings.

Embodiment 1

Figure 1:
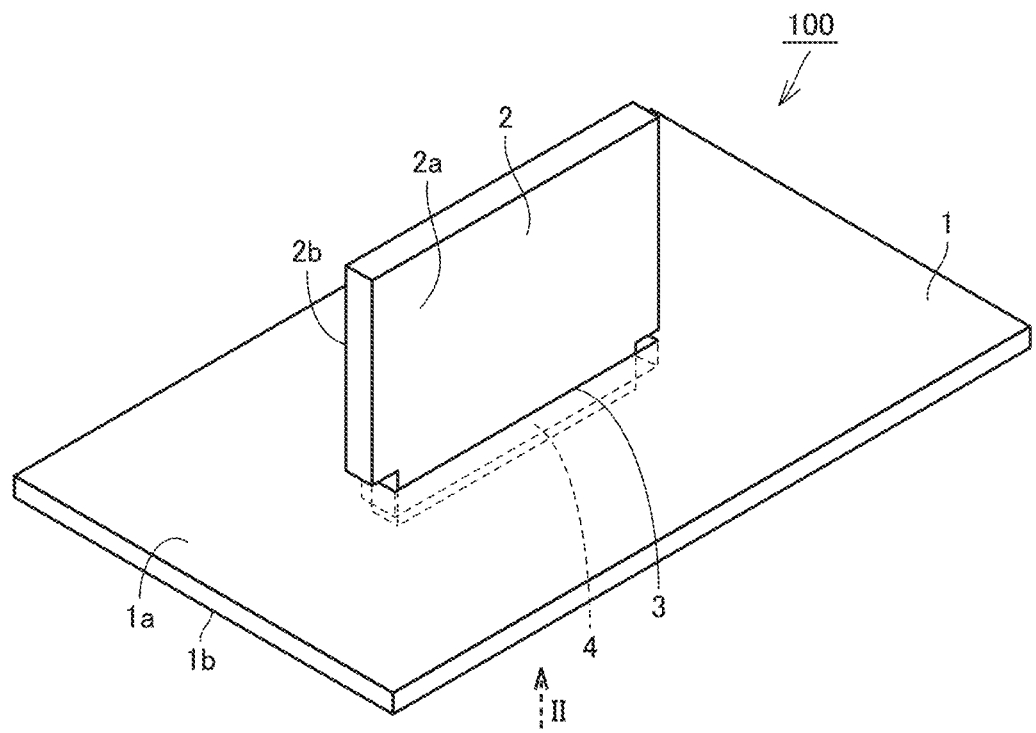
FIG. 1 is a schematic view of showing an overall structure of a three-dimensional printed wiring board according to Embodiment 1.
Figure 2:
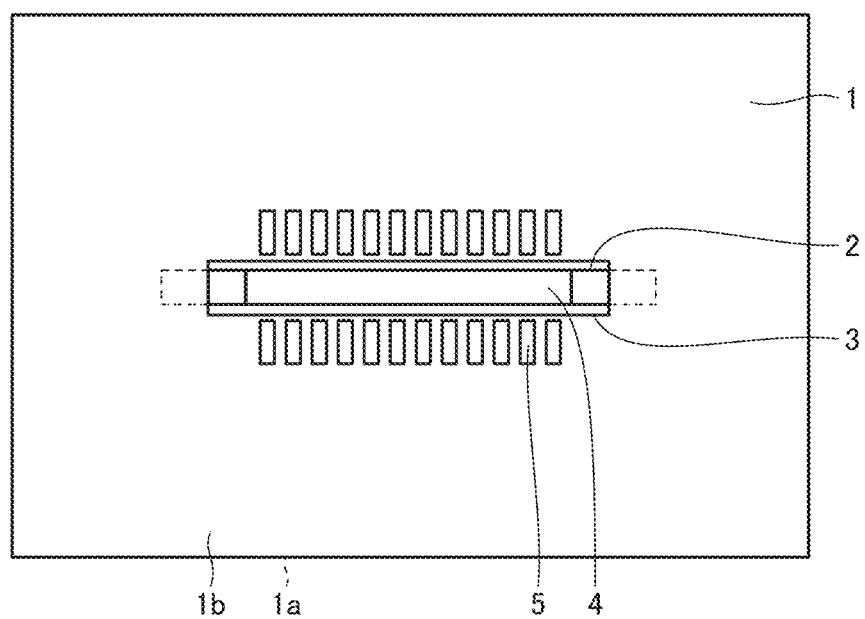
FIG. 2 is a schematic plan view of the three-dimensional printed wiring board of FIG. 1, as viewed from direction II indicated by the arrow in FIG. 1.
Figure 3:
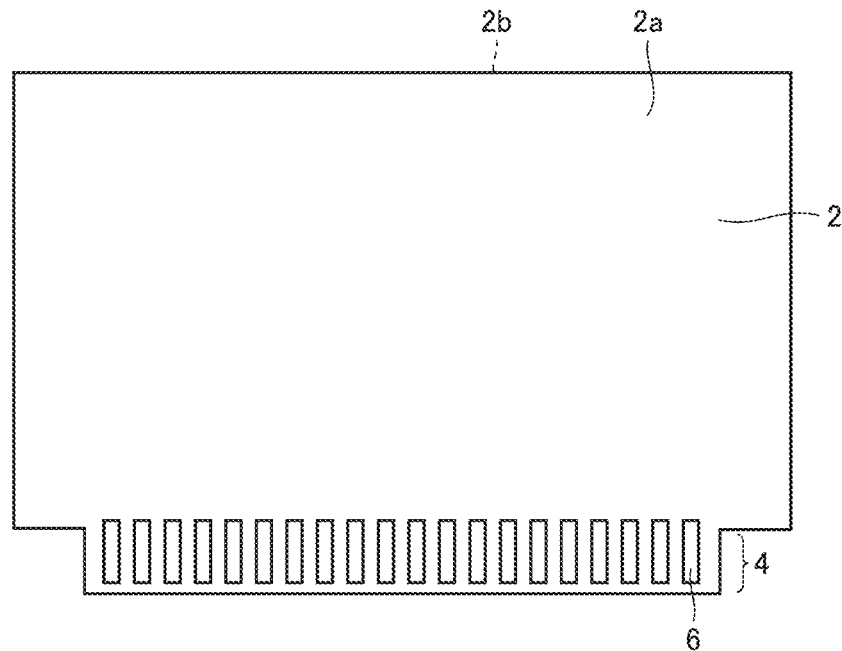
FIG. 3 is a schematic view showing a configuration of a standing substrate included in the three-dimensional printed wiring board of FIG. 1.
Figure 4:
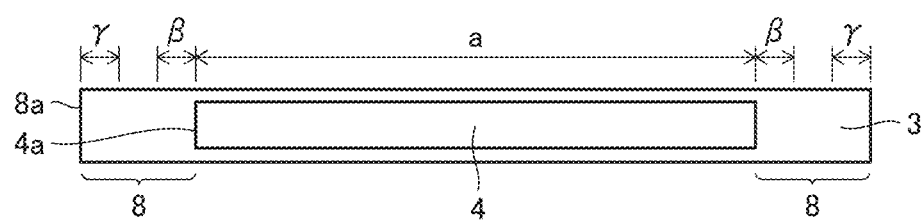
FIG. 4 is a schematic view showing a dimensional relationship between a slit and a support shown in FIG. 2.
Figure 5:
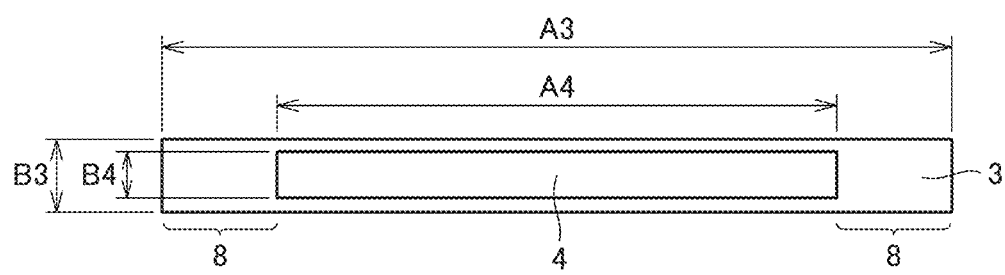
FIG. 5 is a schematic view showing the dimensional relationship between the slit and the support from a different perspective than FIG. 4.

FIG. 1 is a schematic view showing an overall structure of a three-dimensional printed wiring board 100 according to the present embodiment. FIG. 2 is a schematic plan view of three-dimensional printed wiring board 100 of FIG. 1, as viewed from direction II indicated by the arrow in FIG. 1, that is, as viewed from the bottom. FIG. 3 is a schematic view showing a configuration of a standing substrate 2 included in three-dimensional printed wiring board 100 of FIG. 1. FIG. 4 is a schematic view showing a dimensional relationship between a slit 3 and a support 4 shown in FIG. 2. FIG. 5 is a schematic view showing the dimensional relationship between slit 3 and support 4 from a different perspective than FIG. 4. In the following, a configuration of three-dimensional printed wiring board 100 according to the present embodiment will be described, with reference to FIGS. 1 to 5.

Referring to FIG. 1, three-dimensional printed wiring board 100 according to the present embodiment has a parent substrate 1 as a first substrate and standing substrate 2 as a second substrate. Parent substrate 1 has one first primary surface 1a and the other first primary surface 1b. The one first primary surface 1a and the other first primary surface 1b are opposing primary surfaces. The one first primary surface 1a and the other first primary surface 1b of parent substrate 1 generally have a rectangular perimeter. However, the present invention is not limited thereto. The one first primary surface 1a and the other first primary surface 1b may be have, for example, curved (Rshape) or oval four corners. Therefore, parent substrate 1 is a rectangular, planar member, and, typically installed so that the one first primary surface 1a and the other first primary surface 1b extend along the horizontal direction. Here, the one first primary surface 1a is facing up, and the other first primary surface 1b is facing down. The dimension of three-dimensional printed wiring board 100 of FIG. 1 in the depth direction, that is, the direction, generally, extending from the bottom left of the figure to the upper right is greater than the dimension of three-dimensional printed wiring board 100 in a direction intersecting with that direction. Therefore, in FIG. 1, the depth direction corresponds to the longitudinal direction of three-dimensional printed wiring board 100.

Referring to FIGS. 1 and 2, parent substrate 1 has slit 3 formed therein, the slit 3 extending in the direction of thickness (the top-bottom direction of FIG. 1) of parent substrate 1, passing therethrough from the one first primary surface 1a to the other first primary surface 1b. Preferably, slit 3 has an elongated rectangular shape extending along, for example, the longitudinal direction (the left-right direction of FIG. 2) of parent substrate 1. However, the present invention is not limited thereto, as described below.

Referring to FIGS. 1 and 3, standing substrate 2 has one second primary surface 2a and the other second primary surface 2b. The one second primary surface 2a and the other second primary surface 2b are opposing primary surfaces.

Each of these primary surfaces, while it has a rectangular shape for the most part, has a support 4 at the bottom with respect to FIGS. 1 and 3. Support 4 is a region that has, as compared to the other region, a rectangular shape shorter in dimension with respect to the longitudinal direction (the left-right direction of FIG. 3) of the one second primary surface 2a and the other second primary surface 2b. Therefore, in the one second primary surface 2a and the other second primary surface 2b, support 4 projects downward from the region of standing substrate 2, other than support 4.

Referring to FIGS. 1 and 3, support 4 of standing substrate 2 is inserted in slit 3 of parent substrate 1. Thus, support 4 is disposed, projecting downward from the other first primary surface 1b side of parent substrate 1. Therefore, the one second primary surface 2a and the other second primary surface 2b of standing substrate 2 are incorporated into the one first primary surface 1a and the other first primary surface 1b of parent substrate 1 in a manner intersecting with the one first primary surface 1a and the other first primary surface 1b.

As shown in FIG. 2, parent substrate 1 includes at least one parent substrate electrode 5 as a first electrode. Specifically, parent substrate electrode 5 is disposed on the other first primary surface 1b of parent substrate 1. Multiple parent substrate electrodes 5 are disposed longitudinally spaced apart from one another in regions adjacent to one edge and the other edge of slit 3 in the longitudinal direction of slit 3. While parent substrate electrodes 5 has a rectangular shape in FIG. 2, the present invention is not limited thereto. As shown in FIG. 3, at least one standing substrate electrode 6 as a second electrode is disposed on the one second primary surface 2a of support 4 of standing substrate 2. Multiple standing substrate electrodes 6 are disposed longitudinally spaced apart from one another on the surface of support 4 in the longitudinal direction. Although not shown, standing substrate electrodes 6 are disposed also on the other second primary surface 2b of support 4, in the same manner as shown in FIG. 3.

Standing substrate 2 is inserted into slit 3 of parent substrate 1 from the one first primary surface 1a side to the other first primary surface 1b side. Thus, parent substrate electrodes 5 and standing substrate electrodes 6 are disposed so as to be adjacent to each other on the other first primary surface 1b side of parent substrate 1. In this state, parent substrate electrode 5 and standing substrate electrode 6 are solder bonded by, for example, flow soldering. In other words, parent substrate 1, having standing substrate 2 inserted therein, is immersed in a solder bath where a molten solder is jetting, and transported by a conveyor or the like. Accordingly, parent substrate electrode 5 and standing substrate electrode 6 are solder bonded, and secured to parent substrate 1 inserted in standing substrate 2. Thus, parent substrate 1 and standing substrate 2 are bonded in support 4, as shown in FIG. 1.

Parent substrate 1 and standing substrate 2 are formed of materials for typical printed wiring boards. In other words, parent substrate 1 is configured of, for example, CEM-3 or FR-4. CEM-3 is a laminate of a base material using a glass nonwoven fabric impregnated with a flame-retardant epoxy resin, and a base material using a glass fabric impregnated with an epoxy resin for the purposes of reinforcement in strength. FR-4 is a laminate of a base material using a glass fabric impregnated with an epoxy resin.

Patterned traces are formed, as circuits, on the one first primary surface 1a and the other first primary surface 1b of parent substrate 1. Electronic parts, such as a semiconductor chip, a resistor, a capacitor, etc. are also mounted and soldered on the one first primary surface 1a and the other first primary surface 1b of parent substrate 1. Moreover, patterned traces are formed, as circuits, on the one first primary surface 1a and the other first primary surface 1b of parent substrate 1. The same is true for the one second primary surface 2a and the other second primary surface 2b of standing substrate 2. Note that slit 3 is formed by a generally known method, such as stamping or routing using a mold, so as to pass through parent substrate 1 from the one first primary surface 1a to the other first primary surface 1b.

Referring to FIG. 4, the dimension of the opening of slit 3 in the longitudinal direction (the left-right direction of FIG. 4) is greater than the sum of a design dimension a of support 4, inserted in the opening, in the longitudinal direction, a maximum design dimension tolerance of support 4 in the longitudinal direction, and a maximum design dimension tolerance of slit 3 in the longitudinal direction. The maximum design dimension tolerance of support 4 in the longitudinal direction, as used herein, refers to the sum of the two dimensions β shown in FIG. 4. The maximum design dimension tolerance of slit 3 in the longitudinal direction, as used herein, refers to the sum of the two dimensions γ shown in FIG. 4. As shown in FIG. 4, slit gaps 8 are formed within slit 3 having support 4 inserted therein, the slit gaps 8 each being located between an end of support 4 and an end of the inner wall of slit 3 in the longitudinal direction. The sum of the dimensions of the two slit gaps 8 shown in FIG. 4 is greater than the sum of the maximum design dimension tolerance of support 4 in the longitudinal direction and the maximum design dimension tolerance of slit 3 in the longitudinal direction.

Referring to FIG. 5, the dimension A3 of slit 3 in the longitudinal direction is greater than the sum of a design dimension A4 of support 4 in the longitudinal direction, the maximum design dimension tolerance of support 4 in the longitudinal direction, and the maximum design dimension tolerance of slit 3 in the longitudinal direction. Since support 4 is inserted into slit 3, dimension B3 of slit 3 is greater than dimension B4 of support 4 in the width direction intersecting with the longitudinal direction. As one example, it is contemplated that dimension A3 is 54.35 mm, dimension B3 is 1.75 mm, dimension A4 is 53 mm, and dimension B4 is 1.6 mm.

Figure 6:
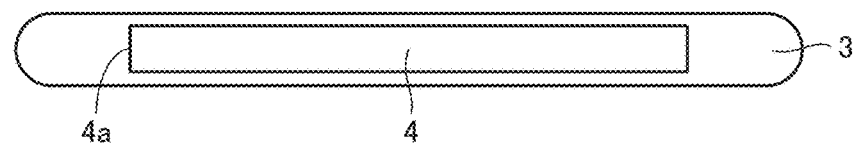
FIG. 6 is a schematic view showing a variation of the shape of the slit formed in a parent substrate according to Embodiment 1.

FIG. 6 is a schematic view showing a variation of the shape of slit 3 formed in parent substrate 1 according to the present embodiment. Referring to FIG. 6, the shape of slit 3 is not limited to a rectangular shape, and may be, for example, the perimeter on one end and the other end of slit 3 in the direction of extension thereof, that is, the longitudinal direction, may have a curved shape, such as a semicircular shape. In addition, although not shown, the perimeter of the four corners of slit 3 may have a curved shape, such as an arc shape. In such a case also, support 4 of standing substrate 2 is inserted within slit 3, as with the above. In the case of FIG. 6, in the shape of the perimeter of slit 3, a distance between the longitudinally, most outwardly projecting portions of the semicircular shapes of the one end and the other end in the longitudinal direction is greater than the sum of the design dimension of support 4 in the longitudinal direction, the maximum design dimension tolerance of support 4 in the longitudinal direction, and the maximum design dimension tolerance of slit 3 in the longitudinal direction, as described above.

Figure 7:
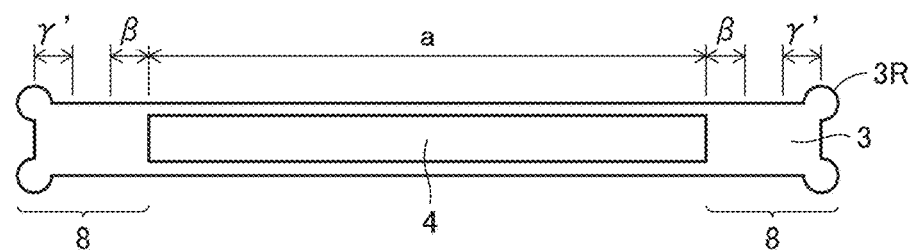
FIG. 7 is a schematic view showing a more realistic shape for the slit of FIG. 4, according to Embodiment 1.

FIG. 7 is a schematic view showing a more realistic shape for the slit of FIG. 4 according to Embodiment 1. Referring to FIG. 7, preferably, slit 3 has a rectangular planner shape.

However, the rectangular corners of slit 3 are formed more or less in arc shapes when parent substrate 1 is drilled to form slit 3. These arc portions may hinder the insertion of support 4 of standing substrate 2 into slit 3. Therefore, preferably, the rectangular corners of slit 3 are relieved when slit 3 is formed. This forms circular relieved portions 3R at the corners of slit 3. In the present embodiment, if relieved portions 3R, as shown in FIG. 7, are formed, the design dimension tolerance of slit 3 in the longitudinal direction is γ'.

Figure 8:
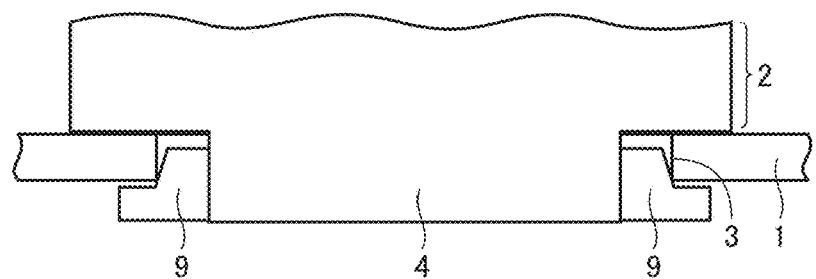
FIG. 8 is a schematic view showing a process of bonding the parent substrate and the standing substrate, according to Embodiment 1.

Next, a method for fabricating three-dimensional printed wiring board 100 according to the present embodiment, in particular, a method for bonding parent substrate 1 and standing substrate 2 will be described. FIG. 8 is a schematic view showing a process for bonding the parent substrate and the standing substrate, according to the present embodiment. Referring to FIG. 8, initially, support 4 of standing substrate 2 is inserted into slit 3 in parent substrate 1 from the one first primary surface 1a side, at which time, standing substrate 2 is inserted in a manner that the one second primary surface 2a, etc. of standing substrate 2 is generally perpendicular to the one first primary surface 1a, etc. of parent substrate 1. Parent substrate electrodes 5 disposed on the other first primary surface 1b of parent substrate 1 and standing substrate electrodes 6 disposed on the one second primary surface 2a and the other second primary surface 2b of standing substrate 2 are aligned.

For the alignment, preferably, jigs, such as spacers 9 shown in FIG. 8, are used. A pair of spacer 9 is inserted between the longitudinal one end of support 4 and an end of the inner wall of slit 3 facing the one end and between the longitudinal other end of support 4 and an end of the inner wall of slit 3 facing the other end, to ensure slit gaps 8 shown in FIGS. 4 and 5. Having spacers 9 inserted as such, parent substrate electrode 5 and standing substrate electrode 6 are solder bonded by flow soldering. In other words, parent substrate 1 having standing substrate 2 inserted therein is immersed in a solder bath where a molten solder is jetting, and transported by a conveyor or the like. Accordingly, standing substrate 2 and parent substrate 1 are secured to substrate 2 being inserted in parent substrate 1.

Next, effects of the present embodiment will be set forth, describing Comparative Example.

Figure 9:
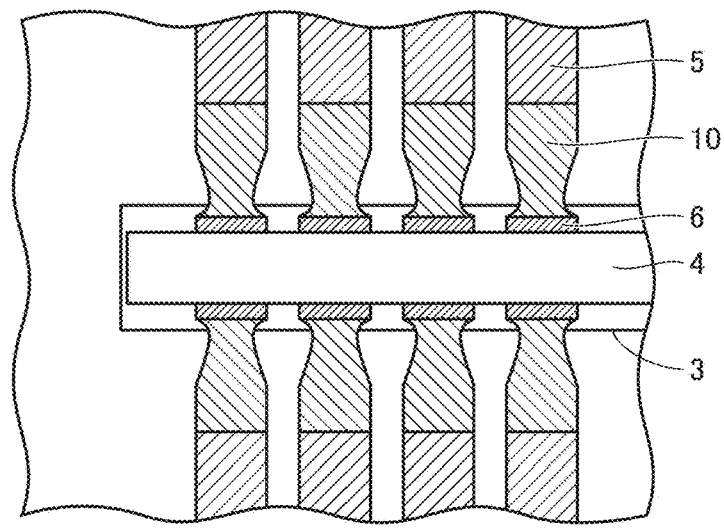
FIG. 9 is a schematic plan view showing a slit having a support inserted and solder bonded thereto, according to Comparative Example.
Figure 10:
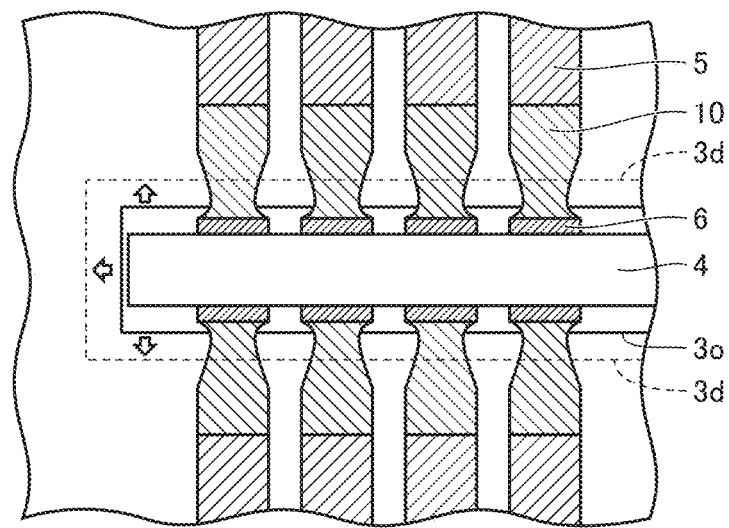
FIG. 10 is a schematic plan view showing the slit when a parent substrate is about to expand due to a temperature change, according to Comparative Example.
Figure 11:
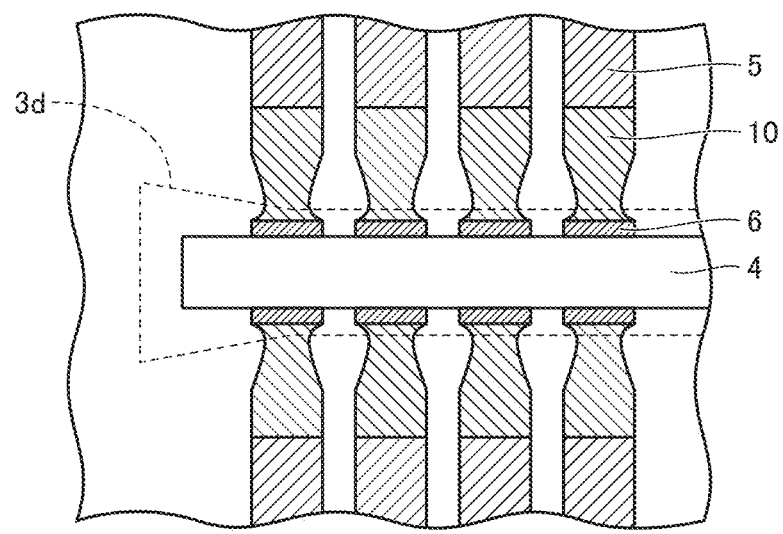
FIG. 11 is a schematic plan view showing the slit when the parent substrate has expanded due to a temperature change, according to Comparative Example.
Figure 12:
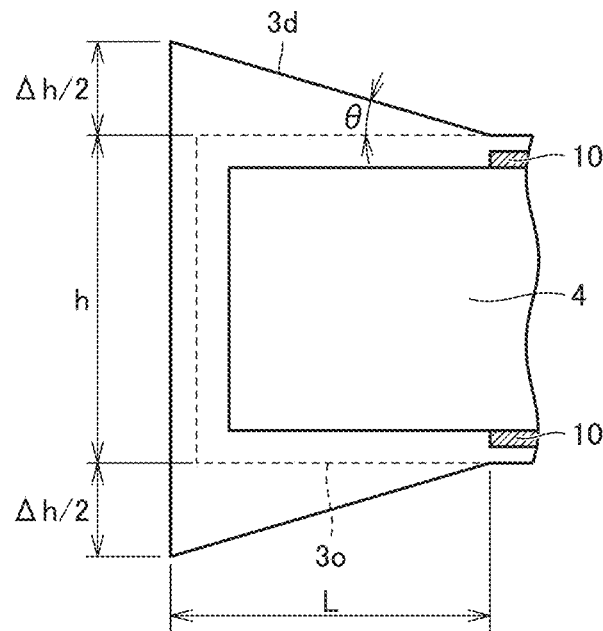
FIG. 12 is a schematic plan view of a close-up of, particularly, a deformed portion of the slit of FIG. 11, showing dimensions and angles of each portion.

FIG. 9 is a schematic plan view showing a manner in which the slit having the support inserted and solder bonded thereto, according to Comparative Example. FIG. 10 is a schematic plan view showing the slit when the parent substrate is about to expand due to a temperature change, according to Comparative Example. FIG. 11 is a schematic plan view showing the slit when the parent substrate has expanded due to a temperature change, according to Comparative Example. FIG. 12 is a schematic plan view of a close-up of, particularly, a deformed portion of the slit of FIG. 11, showing dimensions and angles of each portion. Note that these plan views each show the three-dimensional printed wiring board, as viewed from direction II indicated by the arrow in FIG. 1.

Three-dimensional printed wiring board 100, formed by soldering parent substrate 1 and standing substrate 2 by the fabrication method shown in FIG. 8, is incorporated into a product and operates. However, depending on environment in which the product having three-dimensional printed wiring board 100 incorporated therein is situated, and the use environment of the product, and generation of heat by the parts mounted on three-dimensional printed wiring board 100, three-dimensional printed wiring board 100 is exposed to a hot atmosphere, at which time the three-dimensional printed wiring board 100 expands or contracts in accordance with the coefficient of linear expansion of itself, due to a temperature change surrounding three-dimensional printed wiring board 100.

Referring to FIG. 9, as with three-dimensional printed wiring board 100 according to the present application, support 4 of the standing substrate is inserted into slit 3 of the parent substrate also in the three-dimensional printed wiring board according to Comparative Example. Parent substrate electrodes 5 adjacent to slit 3 and standing substrate electrodes 6 of support 4 are electrically connected and secured by solder 10. However, the dimension of slit 3 according to Comparative Example in the longitudinal direction (the left-right direction in FIG. 9) is not greater than the sum of the design dimension of support 4 in the longitudinal direction, the maximum design dimension tolerance of support 4 in the longitudinal direction, and the maximum design dimension tolerance of slit 3 in the longitudinal direction. In other words, the longitudinal dimension of slit 3 and the longitudinal dimension of support 4 are generally the same. More specifically, the longitudinal dimension of slit 3 is greater than the longitudinal dimension of support 4 by 0.1 mm or less. However, as with the present embodiment, slit 3 has, for example, a rectangular shape (an elongated rectangular shape) at least in a room temperature atmosphere.

Referring to FIG. 10, the three-dimensional printed wiring board of FIG. 9 is transported, for example, from the room temperature atmosphere into a hot atmosphere. This exposes the three-dimensional printed wiring board to the hot atmosphere, causing parent substrate 1 to expand. At this time, the slit is to deform from an initial slit shape 3o into an expanded slit shape 3d. Initial slit shape 3o is a shape of the slit in the room temperature atmosphere as indicated by the solid line. Expanded slit shape 3d is a shape of the slit after exposed to the hot atmosphere as indicated by the dotted line.

However, since parent substrate electrodes 5 and standing substrate electrodes 6 are bonded by solder 10, the joints between the two are not displaceable. Thus, slit 3 expands in width in the longitudinally end region of slit 3 (the left side of FIG. 11), as shown by expanded slit shape 3d in FIG. 11, rather than at the joint by solder 10. Specifically, referring to FIG. 12, h indicates the width of initial slit shape 3o prior to the expansion of slit 3, α indicates the coefficient of linear expansion of parent substrate 1, and Δt indicates a change in temperature of parent substrate 1. Here, the width refers to a dimension of slit 3 in a direction orthogonal to the longitudinal direction of slit 3 in plan view. At this time, a change amount Δh in width h of slit 3 with a change in temperature of parent substrate 1 by Δt is represented by Δh=h×α×Δt. Note that expanded slit shape 3d and standing substrate 2 after the change in the width of slit 3 is symmetric about the centerline through the center of slit 3 in the width direction. Therefore, the change amount of expanded slit shape 3d in the width direction relative to the end of initial slit shape 3o is an equal amount, Δh/2, on the one side (the upper side of FIG. 12) and the other side (the lower side of FIG. 12) of the centerline.

L denotes a distance from the end of expanded slit shape 3d to the nearest joint by solder 10 in the longitudinal direction. At this time, due to the deformation of the slit into expanded slit shape 3d, rotational deformation occurs at the joint by solder 10 that is closest to the end of expanded slit shape 3d. This rotates the longitudinal direction of expanded slit shape 3d by angle θ relative to the longitudinal direction of initial slit shape 3o. Such a rotational force is applied to the joint by solder 10, and thus a strain is applied thereto. This strain may lead to rupture of the joint by solder 10 in a short time.

Figure 13:
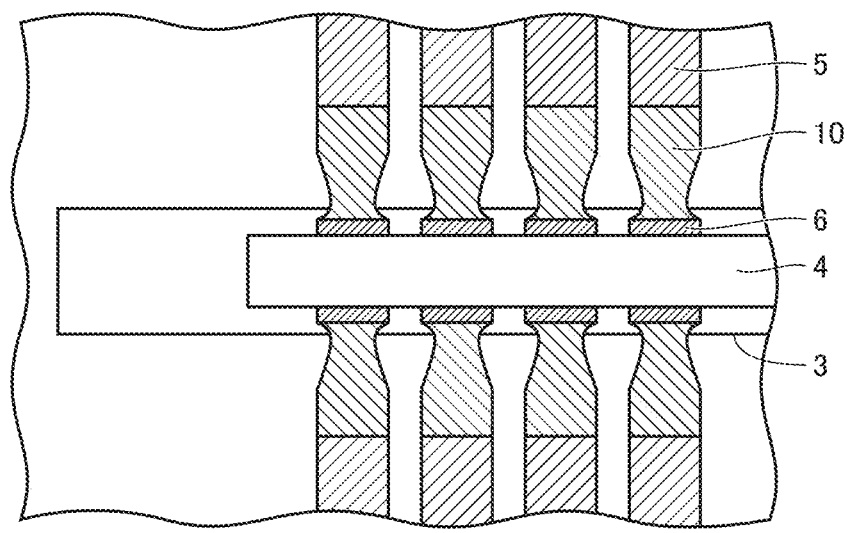
FIG. 13 is a schematic plan view showing the slit having the support inserted and solder bonded thereto, according to Embodiment 1.
Figure 14:
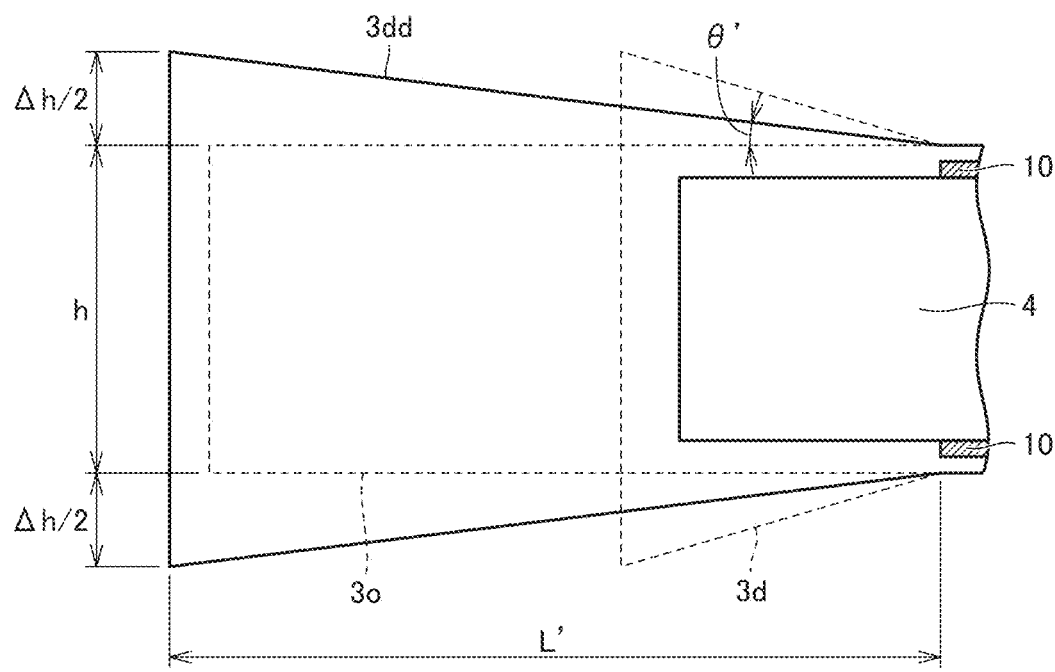
FIG. 14 is a schematic plan view of a close-up of, particularly, a portion of the slit deformed by expansion of the parent substrate caused by a temperature change, showing dimensions and angles of each portion, according to Embodiment 1.

FIG. 13 is a schematic plan view showing the slit having the support inserted and solder bonded thereto, according to the present embodiment. FIG. 14 is a schematic plan view of a close-up of, particularly, a portion of the slit deformed by expansion of the parent substrate caused by a temperature change, showing dimensions and angles of each portion, according to the present embodiment. In other words, FIG. 14 corresponds to FIG. 12 according to Comparative Example. Note that these plan views each show the three-dimensional printed wiring board, as viewed from direction II indicated by the arrow in FIG. 1.

Referring to FIG. 13, in the present embodiment, as described above, the longitudinal dimension of slit 3 is sufficiently greater than the design dimension of support 4 in the longitudinal direction, as compared to Comparative Example. However, referring to FIG. 14, also in the present embodiment, the dimension of initial slit shape 3o has the same width h as Comparative Example in the width direction intersecting with the longitudinal direction. The sign α indicates the coefficient of linear expansion of parent substrate 1, and Δt indicates a temperature change in parent substrate 1. In this case also, as three-dimensional printed wiring board 100 is exposed to a hot atmosphere and parent substrate 1 expands, slit 3 expands in width in the longitudinally end region (the left side of FIG. 14) of slit 3, rather than at the joint by solder 10, as with Comparative Example. However, due to the deformation of the slip into expanded slit shape 3d caused by the application of temperature change Δt, the width of the end of slit 3 increases by Δh, which is the same as Comparative Example. This is because the initial width of slit 3 is h which is the same initial width as Comparative Example. The amount Δh of deformation in the width of the end of slit 3, caused by the application of the temperature change Δt, is uniquely determined by the coefficient of linear expansion of the material of parent substrate 1, and is independent of the longitudinal length of slit 3.

Regarding the longitudinal direction as used in the present embodiment, L' denotes a distance from the end of the expanded slit to the nearest joint by solder 10. L' is greater than L according to Comparative Example. Therefore, due to the deformation of slit 3 the expansion, expanded slit shape 3dd corresponds to expanded slit shape 3d according to Comparative Example. The joint by solder 10 that is closest to the left end of expanded slit shape 3dd is rotated by angle θ' about the longitudinal direction of initial slit shape 3o. Since L'>L, rotational angle $\theta'=\tan^{-1}((\Delta h/2)/L')$ according to the present embodiment is less than rotational angle $\theta=\tan^{-1}((\Delta h/2)/L)$ according to Comparative Example. As such, in the present embodiment, θ' can be reduced by increasing L'. Thus, the strain at the joint by solder 10 can be reduced.

Reduction of the strain at the joint by solder 10 extends the fatigue life of the joint by solder 10. Therefore, according to the present embodiment, the strain at the joint by solder 10, caused by temperature change, is reduced as compared to Comparative Example, thereby extending the lifetime of the solder joint.

Figure 15:
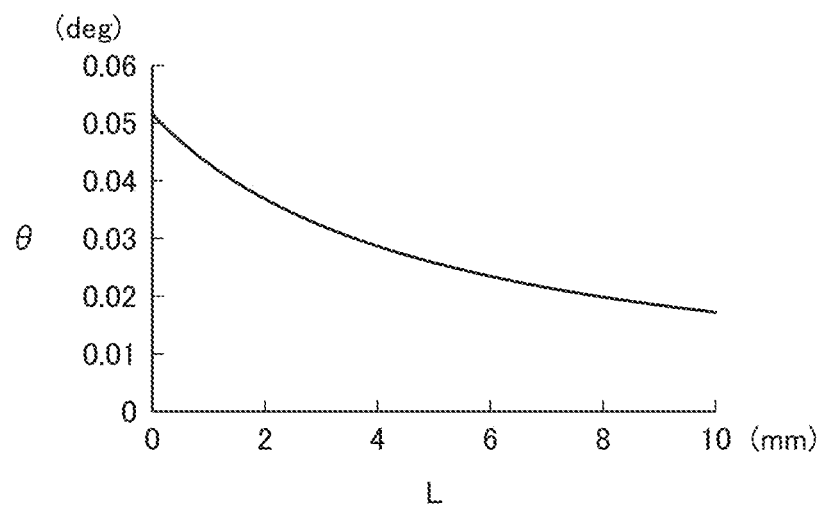
FIG. 15 is a graph showing a distance from an end of the solder joint to a slit end versus a rotational angle of the solder joint.

The distance from the end of expanded slit shape 3d, 3dd, shown in FIG. 12 or 14, to the nearest joint by solder 10 is indicated by L or L' (unit: mm) on the horizontal axis of the graph of FIG. 15. The rotational angle of the joint by solder 10, shown in FIG. 12 or 14, is indicated by θ or θ' (unit: degree) on the vertical axis of FIG. 15. Referring to FIG. 15, it can be seen that θ or θ' decreases with an increase in L or L', reducing the strain, and inhibiting the rupture of the solder joint. As can be seen from FIG. 15, if L is about 4.5 mm, rotational angle θ is about the half, as compared to when L is insignificant. From practical standpoints, preferably, L is κ mm or less, and, more preferably, 4 mm or less.

Table 1 below shows tolerances for the length dimension, excluding chamfers, in millimeter.

TABLE 1

|  |  | Reference Dimension Classification | | | | | | | unit: mm |
|---|---|---|---|---|---|---|---|---|---|
| Tolerance Class | | from 0.5 up to 3 | over 3 up to 6 | over 6 up to 30 | over 30 up to 120 | over 120 up to 400 | over 400 up to 1000 | over 1000 up to 2000 | over 2000 up to 4000 |
| Designation | Description | Tolerances | | | | | | | |
| f | Fine class | ±0.05 | ±0.05 | ±0.1 | ±0.15 | ±0.2 | ±0.3 | ±0.5 | — |
| m | Middle class | ±0.1 | ±0.1 | ±0.2 | ±0.3 | ±0.5 | ±0.8 | ±1.2 | ±2 |
| c | Coarse class | ±0.2 | ±0.3 | ±0.5 | ±0.8 | ±1.2 | ±2 | ±3 | ±4 |
| v | Very coarse class | — | ±0.5 | ±1 | ±1.5 | ±2.5 | ±4 | ±6 | ±8 |

Many of printed wiring boards have a plate thickness of 1.6 mm. Therefore, the reference dimension in Table 1 corresponds to "from 0.5 up to 3." Accordingly, here, if the tolerance class for the processing of the printed wiring board is medium class, the tolerance for the thickness of standing substrate 2 is ±0.1 mm. Accordingly, the difference by subtracting the plate thickness of standing substrate 2 from the width of slit 3 in three-dimensional printed wiring board 100 according to the present embodiment, is about 0.1 mm.

As one example, if the longitudinal lengths of slit 3 and support 4 are "over 30 mm up to 120 mm," the design dimension tolerances for slit 3 and support 4 in the longitudinal direction are ±0.3 mm. Accordingly, the maximum tolerances for slit 3 and support 4 are +0.3 mm, and thus the longitudinal length of slit 3 according to the present embodiment is longer than the longitudinal length of support 4 by 0.6 mm. As another example, if the longitudinal lengths of slit 3 and support 4 are "over 120 mm up to 400 mm," the design dimension tolerances for slit 3 and support 4 in the longitudinal direction are ±0.5 mm. Accordingly, the maximum tolerances for slit 3 and support 4 are +0.5 mm, and thus the longitudinal length of slit 3 according to the present embodiment is longer than the longitudinal length of support 4 by 1.0 mm.

As described with reference to the above one example, dimension A3 is 54.35 mm and dimension A4 is 53 mm in FIG. 5. Therefore, the difference in longitudinal dimension between slit 3 and support 4 is 1.35 mm. This is the sum of the differences on the one side and on the other side of support 4 in the longitudinal dimension. Therefore, suppose that the dimensional differences on the one side and on the other side of support 4 are equal, the difference on the one side or the other side of support 4 in the longitudinal dimension, that is, the dimensional difference on either side of support 4 is 0.675 mm. This dimensional difference meets the condition that the difference in longitudinal dimension between slit 3 and support 4 is longer than 0.6 mm when the reference dimension is "greater than 30 mm and 120 mm or less." If the design dimension in the longitudinal direction is "greater than 30 mm and 120 mm or less" and the dimensional difference between the two is slightly longer than 0.6 mm, which is a worst case scenario, support 4 and slit 3 would come into contact. Therefore, in mass production, preferably, the design dimension tolerance is set greater than the above minimum value by at least an amount of expansion of 0.1 mm, that is, at least 0.05 mm for either side of the support, considering an amount of expansion of the printed wiring board due to a temperature increase in use environment. Doing so can prevent support 4 and slit 3 from coming into contact.

Therefore, the following statements can apply. For example, in FIG. 4, slit gap 8, as a first slit gap, is formed between an end 4a of support 4 in the longitudinal direction and an end 8a of slit 3 in the longitudinal direction. The length of slit gap 8 in the longitudinal direction of support 4 and slit 3 is 0.65 mm or greater for each side of slit 3. Doing so facilitates the insertion of support 4 of standing substrate 2 into slit 3 of parent substrate 1. This can also ensure an increased dimension L of FIG. 12. Therefore, the reliability at the solder joint can be improved.

Embodiment 2

Figure 16:
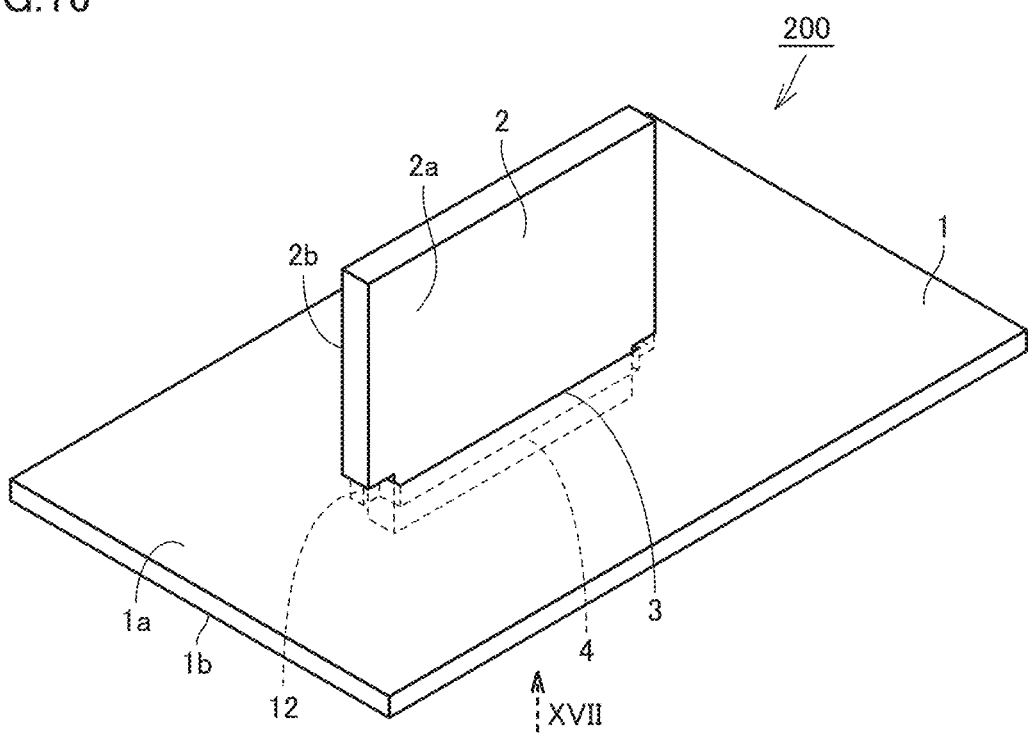
FIG. 16 is a schematic view showing an overall structure of a three-dimensional printed wiring board according to a first example of Embodiment 2.
Figure 17:
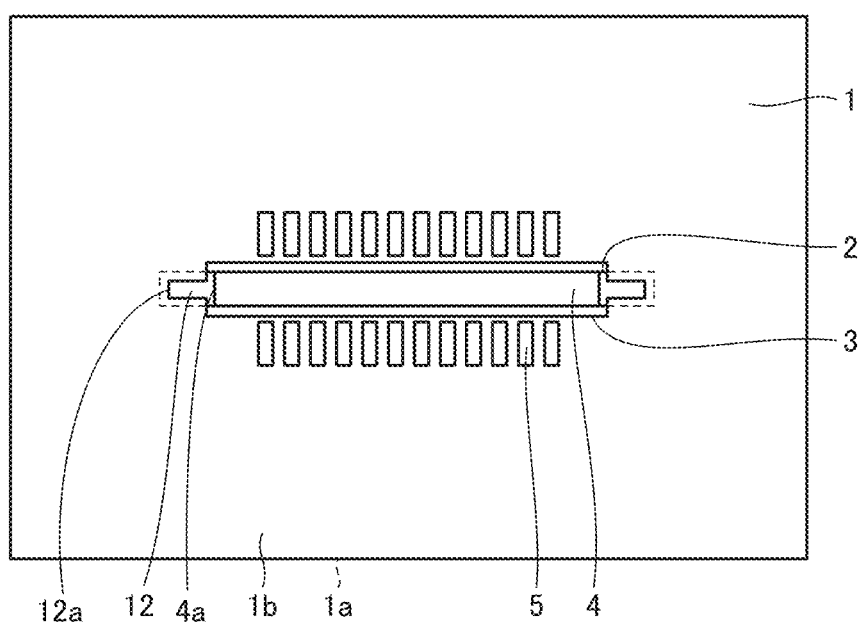
FIG. 17 is a schematic plan view of the three-dimensional printed wiring board of FIG. 16, as viewed from direction XVII indicated by the arrow in FIG. 16.
Figure 18:
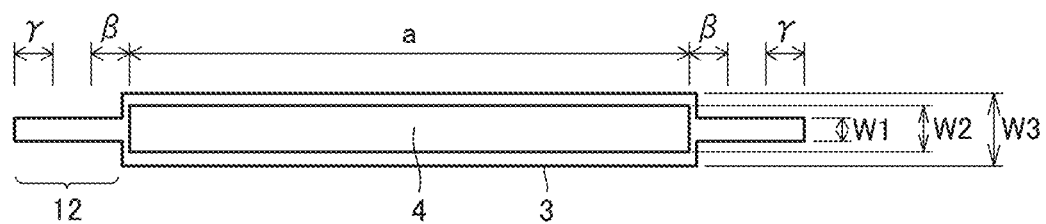
FIG. 18 is a schematic view showing a dimensional relationship between a slit and a support shown in FIG. 17.

FIG. 16 is a schematic view showing an overall structure of a three-dimensional printed wiring board 200 according to a first example of the present embodiment. FIG. 17 is a schematic plan view of three-dimensional printed wiring board 200 of FIG. 16, as viewed from direction XVII indicated by the arrow in FIG. 16, that is, as viewed the bottom. FIG. 18 is a schematic view showing a dimensional relationship between a slit 3 and a support 4 shown in FIG. 17. In the following, a configuration of three-dimensional printed wiring board 200 according to the first example of the present embodiment will be described, with reference to FIGS. 16 to 18.

Referring to FIGS. 16 and 17, three-dimensional printed wiring board 200 according to the first example of the present embodiment, basically, has the same configuration as three-dimensional printed wiring board 100 according to Embodiment 1. Therefore, the same reference signs as Embodiment 1 refer to the same components in the present embodiment and the description thereof will not be repeated. However, the shape of slit 3 according to the present embodiment is different from slit 3 according to Embodiment 1.

To illustrate, in the present embodiment, consider a slit gap 12, which is a portion of slit 3 between the inner wall of slit 3 at an end in the longitudinal direction and an end of support 4 in the longitudinal direction. In other words, slit gap 12 is formed at an end of slit 3 in the longitudinal direction. In the present embodiment, a first width, which is the width of slit gap 12 as the first slit gap in the direction (the top-bottom direction of FIG. 17) intersecting with the longitudinal direction of slit 3 is less than a second width, which is the width of the portion of slit 3, other than slit gap 12. A characteristic of slit 3 according to the present embodiment is that such a slit gap 12 is formed at the one end and the other end of slit 3 in the longitudinal direction. Since slit gap 12 is formed at the ends of slit 3, the ends are formed, in plan view, projecting from the portions of slit 3 that have the second width. The relationship between end 4a and end 12a in FIG. 17 is the same as the relationship between end 4a and end 8a according to Embodiment 1.

Further, the first width of slit gap 12 is less than the thickness of standing substrate 2, the thickness corresponding to the gap between the one second primary surface 2a and the other second primary surface 2b of a standing substrate 2 inserted in slit 3. In summary, referring to FIG. 18, first width W1 of slit gap 12 of slit 3 is less than second width W3 of the portion of slit 3, other than slit gap 12. First width W1 of slit gap 12 is also less than thickness W2 of standing substrate 2 (support 4). Accordingly, support 4 is inserted only in the region of slit 3 that has second width W3. Support 4 is not inserted in slit gap 12 having first width W1.

As shown in FIG. 18, also in the present embodiment, the dimension of the entirety of slit 3, including slit gap 12, in the longitudinal direction (the left-right direction of FIG. 18) is greater than the sum of a design dimension a of support 4, inserted in slit 3, in the longitudinal direction, a maximum design dimension tolerance of support 4 in the longitudinal direction, and a maximum design dimension tolerance of slit 3 in the longitudinal direction. The maximum design dimension tolerance of support 4 in the longitudinal direction, as used herein, refers to the sum of the two dimensions β shown in FIG. 4. The maximum design dimension tolerance of slit 3 in the longitudinal direction, as used herein, refers to the sum of the two dimensions γ shown in FIG. 4. Preferably, the sum of the longitudinal dimensions of the two slit gaps 12 shown in FIG. 18 is greater than the sum of the maximum design dimension tolerance of support 4 in the longitudinal direction and the maximum design dimension tolerance of slit 3 in the longitudinal direction.

Note that, in three-dimensional printed wiring board 200, the longitudinal length of slit gap 12 is shorter than the longitudinal length of the region of standing substrate 2, other than support 4 inserted in slit 3.

Figure 19:
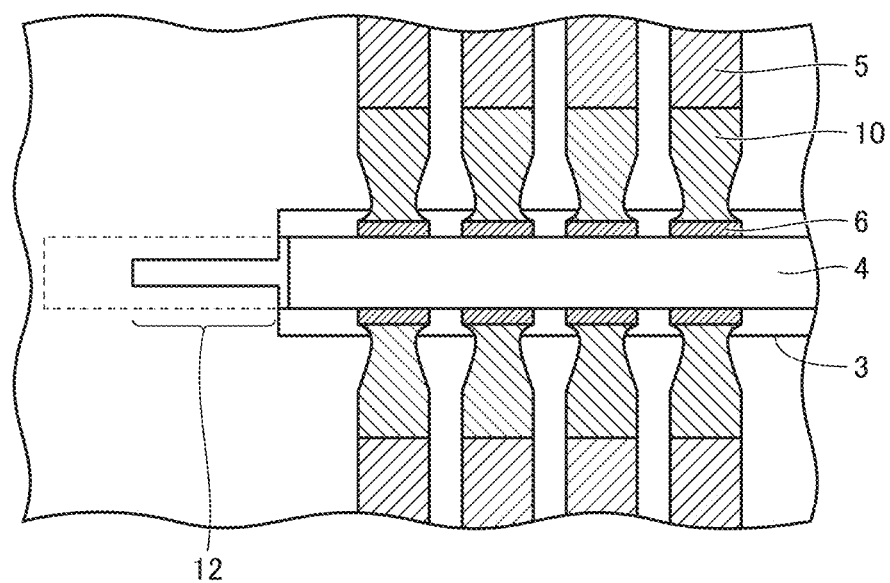
FIG. 19 is a schematic plan view showing a slit having a support inserted and solder bonded thereto, according to the first example of Embodiment 2.
Figure 20:
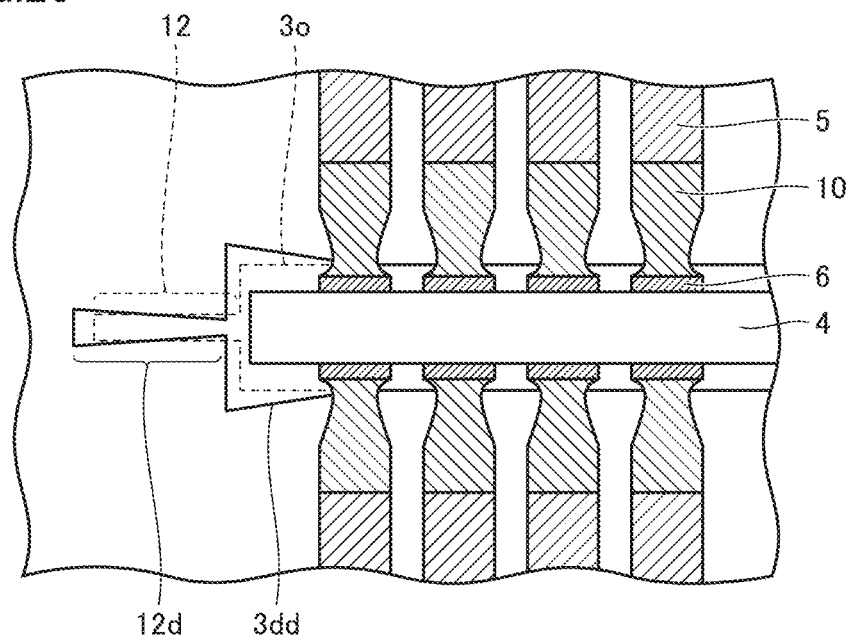
FIG. 20 is a schematic plan view showing the slit when a parent substrate has expanded due to a temperature change, according to the first example of Embodiment 2.
Figure 21:
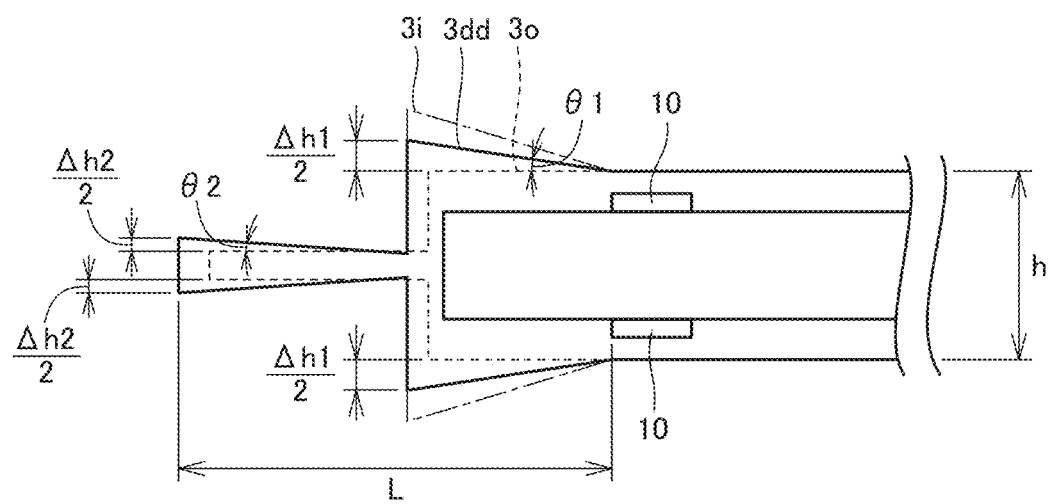
FIG. 21 is a schematic plan view of a close-up of, particularly, a portion of the slit deformed by expansion of the parent substrate caused by a temperature change, showing dimensions and angles of each portion, according to the first example of Embodiment 2.

FIG. 19 is a schematic plan view showing the slit having the support inserted and solder bonded thereto, according to the first example of the present embodiment. In other words, FIG. 19 corresponds to FIG. 13 according to Embodiment 1. FIG. 20 is a schematic plan view showing the slit when the parent substrate has expanded due to a temperature change, according to the first example of the present embodiment. FIG. 21 is a schematic plan view of a close-up of, particularly, a portion of the slit deformed by expansion of the parent substrate caused by a temperature change, showing dimensions and angles of each portion, according to the present embodiment. In other words, FIG. 21 corresponds to FIG. 14 according to Embodiment 1. Note that these plan views each show the three-dimensional printed wiring board, as viewed from direction II indicated by the arrow in FIG. 1. Next, effects of the present embodiment will be described, with reference to FIGS. 19 to 21.

Referring to FIG. 19, in the present embodiment, slit gap 12 is formed between a longitudinal end of slit 3 and a longitudinal end of support 4 inserted in slit 3, the slit gap 12 being narrower than the other region of slit 3. This allows an extended distance from the end of slit 3, including slit gap 12, to the nearest joint by solder 10, as compared to a slit having no slit gap 12.

Referring to FIG. 20, as with Embodiment 1, three-dimensional printed wiring board 200 is exposed from a room temperature to a hot atmosphere and a parent substrate 1 expands also in the present embodiment. This causes slit 3 to deform from initial slit shape 3o to expanded slit shape 3dd in a region on the end side of slit 3, rather than at the joint by solder 10.

Referring to FIG. 21, slit 3 expands in width in a longitudinally end region of slit 3 (the left side of FIG. 21), rather than at the joint by solder 10. L indicates a distance from the joint by solder 10 to the end of slit gap 12, h indicates a second width of initial slit shape 3o before the expansion, a indicates the coefficient of linear expansion of parent substrate 1, and Δt indicates a change in temperature of parent substrate 1. Then, as the temperature of parent substrate 1 changes by Δt, the width of the region of slit 3 having the second width changes by Δh1 and the width of the region having the first width change by Δh2. Note that Δh1+Δh2<Δh (see FIG. 12) stands, and Δh1<Δh, Δh2<Δh stands. A comparative shape 3i, indicated by the dot-dash line in FIG. 21, illustrates an amount of deformation of slit 3 in FIG. 21, assuming that slit gap 12 according to the present embodiment is not present. One can notice that an amount of deformation (an amount of change in dimension) of expanded slit shape 3dd according to the present embodiment is reduced, even by comparing it with comparative shape 3i.

As such, the amounts of changes in dimension of individual ends are less, as compared to Embodiment 1, for the following reasons. In other words, the presence of slit gap 12 extends distance L from the end of the joint by solder 10 to the end of slit 3, and a stress is applied to slit 3 in a direction in which the displacement of the end of the region of slit 3 having the second width is reduced.

Note that, as with Embodiment 1, expanded slit shape 3dd and standing substrate 2 after the change in width of slit 3 are each symmetric about the centerline through the center of slit 3 in the width direction. Therefore, the change amount of the end of expanded slit shape 3d in the width direction relative to the end of initial slit shape 3o is Δh1/2 (the region of slit 3 having the second width) on one side (the upper side of FIG. 12) and Δh2/2 (slit gap 12) on the other side (the lower side of FIG. 12) of the centerline, Δh1/2 and Δh2/2 being an equal amount.

From the foregoing, in the present embodiment, as with Embodiment 1, a rotational angle θ1 at the joint by solder 10 is less than a rotational angle θ at the joint by solder 10 according to Comparative Example of FIG. 12. Conversely, preferably, a rotational angle θ2 at the root (the rightmost portion in FIG. 21) of slit gap 12 is greater than a rotational angle θ1 due to the deformation of slit 3. This reduces the width of the root of slit gap 12 in expanded slit shape 3dd narrower than in initial slit shape 3o before the deformation of slit 3. The reduction in width of the root of slit gap 12 allows reduction of rotational angle θ1 at the joint by solder 10. Therefore, as with Embodiment 1, reduction in strain at the joint by solder 10 is achieved. This allows the lifetime of the solder joint to be extended.

In the present embodiment, the formation of slit gap 12 extends the distance from the end of slit 3, including slit gap 12, to the solder joint. Therefore, the longitudinal length of the region of slit 3 having the second width may be a length as close as possible to the longitudinal length of support 4 (minimum possible length that allows insertion of support 4). In other words, more specifically, the longitudinal dimension of the region of slit 3 having the second width is greater than the longitudinal dimension of support 4 by 0.1 mm. In this way, displacement of the position of standing substrate 2 relative to parent substrate 1, particularly, in the longitudinal direction, can be suppressed. Accordingly, in the present embodiment, standing substrate 2 can be positioned with high accuracy, without the use of spacer 9 for determining the longitudinal position of standing substrate 2 as Embodiment 1. Also, the longitudinal length of the region of slit 3 having the second width being made as close as possible to the longitudinal length of support 4 can eliminate the potential of the region of standing substrate 2, other than support 4, being inserted into the region of slit 3 having the second width. Therefore, standing substrate 2 can be positioned with high accuracy also in the direction of thickness (the top-bottom direction in FIG. 16) of parent substrate 1.

Figure 22:
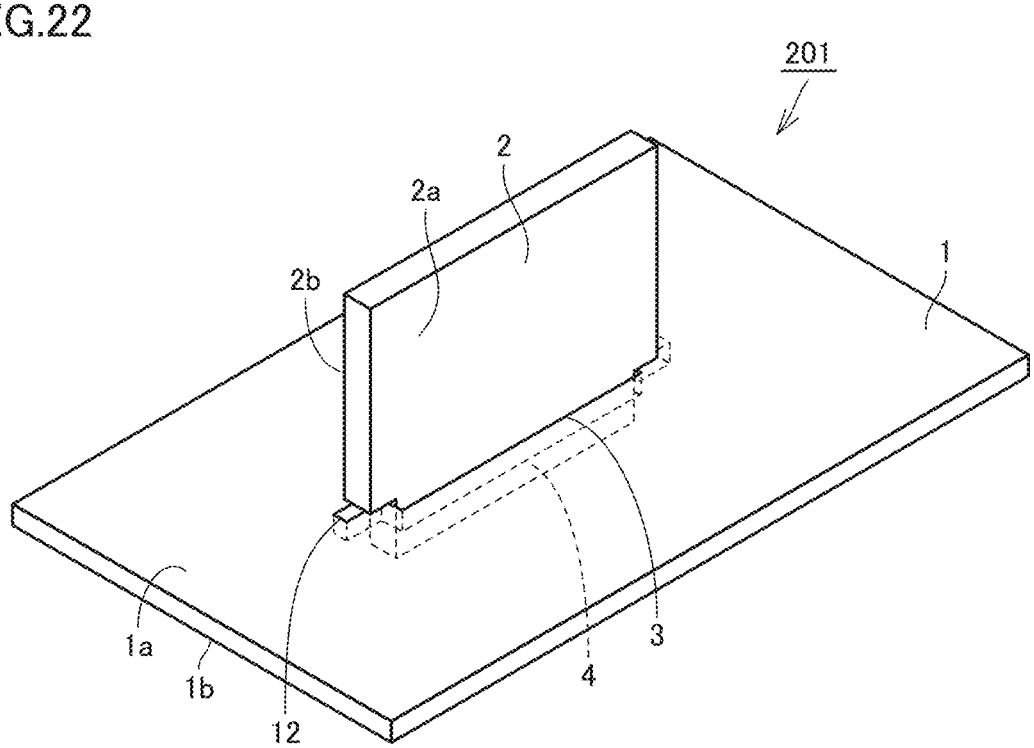
FIG. 22 is a schematic view showing an overall structure of a three-dimensional printed wiring board according to a second example of Embodiment 2.

FIG. 22 is a schematic view showing an overall structure of a three-dimensional printed wiring board 201 according to a second example of the present embodiment. Referring to FIG. 22, three-dimensional printed wiring board 201 according to the second example of the present embodiment, basically, has the same configuration as three-dimensional printed wiring board 200 according to the first example. Therefore, the same reference signs as the first example refer to the same components in the second example and the description thereof will not be repeated. However, the longitudinal length of slit gap 12 in three-dimensional printed wiring board 201 is longer than the longitudinal length of the region of standing substrate 2, other than support 4 inserted in slit 3. In this respect, three-dimensional printed wiring board 201 is different from three-dimensional printed wiring board 200 in which the longitudinal length of slit gap 12 is shorter than the longitudinal length of the region of standing substrate 2, other than support 4.

In this way also, the same effects as three-dimensional printed wiring board 200 can be obtained. Furthermore, slit gap 12 according to this example is longer than the first example. Therefore, based on the same theory as Embodiment 1, the effects of reducing the strain at the joint by solder 10 are greater than, for example, the first example of the present embodiment.

In summary, in the present embodiment, slit gap 12 having a width narrower than the plate thickness of standing substrate 2 is formed in slit 3 of parent substrate 1 so as to project from the region of slit 3 having the second width, as with the first example and the second example. This can prevent the region of standing substrate 2, other than support 4, from falling into slit 3 even if the longitudinal length of the region of standing substrate 2, other than support 4, is not sufficiently greater than the longitudinal length of support 4. This also allows the alignment of parent substrate electrodes 5 and standing substrate electrodes 6 with high accuracy. This further yields the strain reduction effects as with Embodiment 1.

Embodiment 3

Figure 23:
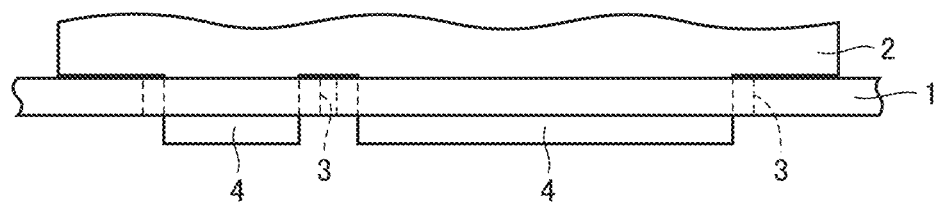
FIG. 23 is a front view showing a configuration of a three-dimensional printed wiring board, particularly, a slit and a support, according to Embodiment 3.
Figure 24:
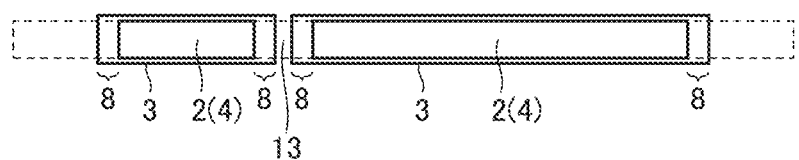
FIG. 24 is a plan view showing the configuration of the three-dimensional printed wiring board, particularly, the slit and the support, according to Embodiment 3, as viewed from the bottom.
Figure 25:
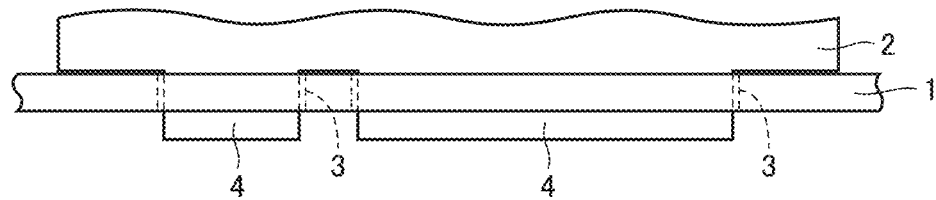
FIG. 25 is a front view showing a configuration of a three-dimensional printed wiring board, particularly, a slit 3 and a support 4, according to Comparative Example.
Figure 26:
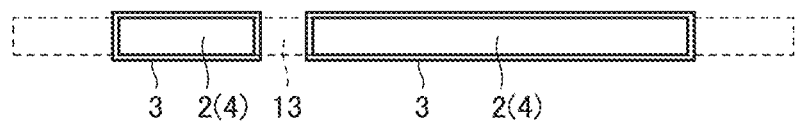
FIG. 26 is a plan view showing the configuration of the three-dimensional printed wiring board, particularly, slit 3 and support 4, according to Comparative Example.

FIG. 23 is a front view showing a configuration of a three-dimensional printed wiring board, particularly, a slit 3 and a support 4, according to the present embodiment. FIG. 24 is a plan view showing a configuration of the three-dimensional printed wiring board, particularly, slit 3 and support 4, according to the present embodiment, as viewed from the bottom, as with FIG. 2. FIG. 25 is a front view showing a configuration of a three-dimensional printed wiring board, particularly, a slit 3 and a support 4, according to Comparative Example. FIG. 26 is a plan view showing the configuration of the three-dimensional printed wiring board, particularly, slit 3 and support 4, according to Comparative Example.

Referring to FIGS. 23 and 24, in the three-dimensional printed wiring board according to the present embodiment, multiple slits 3 are formed in a parent substrate 1, spaced apart from each other in the longitudinal direction of parent substrate 1. Moreover, multiple supports 4 are formed in a standing substrate 2, spaced apart from each other in the longitudinal direction of standing substrate 2. A longitudinal dimension of each of multiple slits 3 of parent substrate 1 is, as with Embodiment 1, greater than the sum of a design dimension of support 4 in the longitudinal direction, a maximum design dimension tolerance of support 4 in the longitudinal direction, and a maximum design dimension tolerance of slit 3 in the longitudinal direction.

As one example, FIGS. 23 and 24 illustrate parent substrate 1 having two slits 3 side by side and standing substrate 2 having two supports 4 side by side. However, the present disclosure is not limited thereto. The above statement is true even in the case where three or more slits 3 and three or more supports 4 are formed.

Effects of the present embodiment are as follows. In Comparative Example of FIGS. 25 and 26, the longitudinal dimension of each of multiple slits 3 is generally the same as the longitudinal dimension of support 4 inserted in slit 3. More specifically, the longitudinal dimension of slit 3 is greater than the longitudinal dimension of support 4 by 0.1 mm. In this case, slit 3 can expand and contract with a change in temperature of the longitudinal end of slit 3, as described with reference to Embodiments 1, 2. Rather, a bridge 13 also expands and contracts with a temperature change, the bridge 13 being a region between the pair of slits 3 disposed side by side longitudinally spaced apart from each other. Therefore, rupture may occur, starting from a joint by solder at a terminal in the region of standing substrate 2 located at the longitudinally center portion and adjacent to bridge 13.

Thus, as with the present embodiment, the longitudinal dimension of each slit 3 is made sufficiently long for support 4. This can make distance L from the end of slit 3, which can expand and contract, to the nearest joint by solder 10 sufficiently great (see FIG. 14), as with Embodiment 1. Accordingly, based on the same theory as Embodiment 1, strain applied to the joint by solder 10 can be reduced.

Embodiment 4

Figure 27:
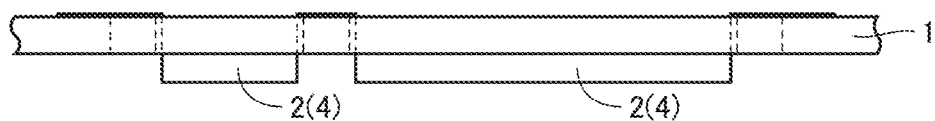
FIG. 27 is a front view showing a configuration of a three-dimensional printed wiring board, particularly, a slit and a support, according to Embodiment 4.
Figure 28:
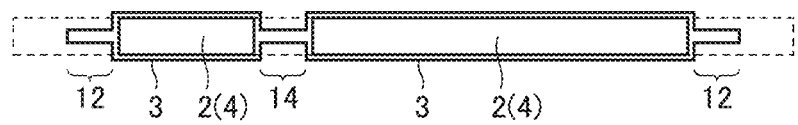
FIG. 28 is a plan view showing the configuration of the three-dimensional printed wiring board, particularly, the slit and the support, according to Embodiment 4, as viewed from the bottom.

FIG. 27 is a front view showing a configuration of a three-dimensional printed wiring board, particularly, a slit 3 and a support 4, according to the present embodiment. FIG. 28 is a plan view showing the configuration of the three-dimensional printed wiring board, particularly, slit 3 and support 4, according to the present embodiment, as viewed from the bottom, as with FIG. 2. Referring to FIGS. 27 and 28, in the three-dimensional printed wiring board according to the present embodiment, multiple slits 3 are formed in a parent substrate 1, spaced apart from each other in the longitudinal direction of parent substrate 1. Moreover, multiple supports 4 are formed in a standing substrate 2, spaced apart from each other in the longitudinal direction of standing substrate 2. Moreover, in FIGS. 27 and 28, a slit gap 12, as a first slit gap, is also formed in one end and the other end of each slit 3 in the longitudinal direction, as with Embodiment 2. Furthermore, in FIGS. 27 and 28, a slit gap for each of the pair of slits 3 is formed in the region between the pair of slits 3 adjacent to each other. The pair of slit gaps in this region, extending in the longitudinal direction, are coupled together and formed as a coupled slit gap 14 serving as a single second slit gap.

In other words, in the present embodiment, coupled slit gap 14 is formed, as a slit gap having a first width, between the pair of slits 3, adjacent to each other among multiple slits 3, so that coupled slit gap 14 couples the pair of slits 3 together, as with Embodiment 2. As with slit gap 12, coupled slit gap 14 extends along the longitudinal direction of slit 3. Moreover, as with slit gap 12 according to Embodiment 2, coupled slit gap 14 has a first width, in a direction (the top-bottom direction in FIG. 28) intersecting with the longitudinal direction, less than the second width of the portion of slit 3, other than slit gap 12. Moreover, coupled slit gap 14 has a first width less than the thickness of standing substrate 2 inserted in slit 3.

As one example, FIGS. 27 and 28 illustrate parent substrate 1 having two slits 3 side by side, standing substrate 2 having two supports side by side, and one coupled slit gap 14 formed. However, the present disclosure is not limited thereto. The above statement is true even in the case where three or more slits 3 and three or more supports 4 are formed and two or more coupled slit gaps 14 are formed.

Next, effects of the present embodiment will be described. Coupled slit gap 14 is provided between the pair of slits 3 to couple them. This allows mechanical insulation of the region between the pair of slits 3 adjacent to each other in the longitudinal direction. Therefore, even in the event of a temperature change in parent substrate 1, parent substrate 1 does not expand and contract because there is a space in coupled slit gap 14 which is the bridge between slits 3. Accordingly, the pair of slits 3, sandwiching coupled slit gap 14, cannot deform such as them moving away from or toward each other. This can inhibit a strain from occurring at a solder joint in a region of the three-dimensional printed wiring board adjacent to coupled slit gap 14. As a result, for example, the strain at a terminal portion in the longitudinal center portion of standing substrate 2, caused by expansion and contraction of bridge 13 in Embodiment 3, can be inhibited from occurring. Therefore, as with Embodiment 1, effects of reducing the strain at the solder joint in the longitudinal center portion of standing substrate 2 can also be obtained. The other effects of the present embodiment are basically the same as Embodiment 2.

Embodiment 5

Figure 29:
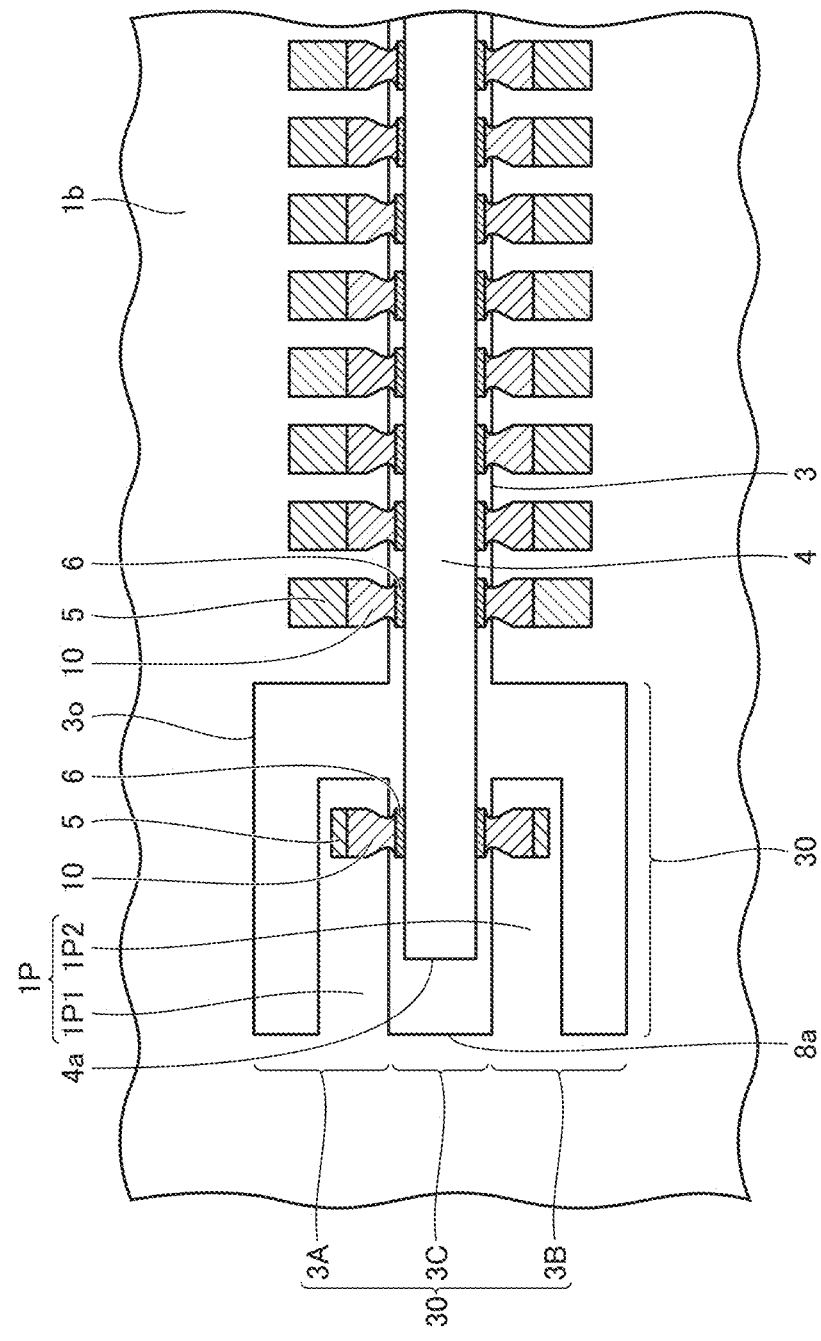
FIG. 29 is a schematic plan view showing a slit having a support inserted and solder bonded thereto, according to a first example of Embodiment 5.

FIG. 29 is a schematic plan view showing a slit having a support inserted and solder bonded thereto, according to a first example of Embodiment 5. As with FIGS. 9 to 11, the plan view of FIG. 29 shows a three-dimensional printed wiring board, as viewed from direction II indicated by the arrow in FIG. 1. This is the same for FIGS. 30 to 34 described below.

Referring to FIG. 29, the three-dimensional printed wiring board according to the first example of the present embodiment is different from the other embodiments above in an end-contiguous region 30 which is a region adjacent to an end 8a of a slit 3 in the longitudinal direction. Specifically, in FIG. 29, slit 3 branches into a first slit portion 3C and a pair of second slit portions 3A, 3B in end-contiguous region 30. Particularly, in FIG. 29, slit 3 branches at a point, in end-contiguous region 30, farthest away from end 8a. First slit portion 3C is where a support 4 is inserted. First slit portion 3C extends along the left-right direction in the figure straightforward from the region of slit 3, other than end-contiguous region 30.

In contrast, the pair of second slit portions 3A, 3B are formed as being branched off from first slit portion 3C at the point, in end-contiguous region 30, farthest away from end 8a. Second slit portion 3A branches off from first slit portion 3C, extending upward in the figure. Second slit portion 3A has a bent from which it extends along the longitudinal direction of support 4 and slit 3 to the end 8a side. Second slit portion 3B branches off from first slit portion 3C, extending downward in the figure. Second slit portion 3B has a bent at which it extends along the longitudinal direction of support 4 and slit 3 to the end 8a side. This causes the pair of second slit portions 3A, 3B to extend in the longitudinal direction, spaced apart from each other in the top-bottom direction of FIG. 29 intersecting with the longitudinal direction of first slit portion 3C. The contour shape of end-contiguous region 30 in FIG. 29 is drawn as initial slit shape 3o.

As described above, end-contiguous region 30 of slit 3 consists of first slit portion 3C and the pair of second slit portions 3A, 3B sandwiching first slit portion 3C therebetween in the top-bottom direction of FIG. 29, spaced apart from each other. Therefore, a pair of beam portions 1P of parent substrate 1 is formed in a parent substrate 1. Specifically, beam portion 1P1 is formed from the body portion of parent substrate 1 so as to be sandwiched between first slit portion 3C and second slit portion 3A. Beam portion 1P2 is formed from the body portion of parent substrate 1 so as to be sandwiched between first slit portion 3C and second slit portion 3B. The pair of beam portions 1P, consisting of beam portion 1P1 and beam portions 1P2, is formed as such so as to be sandwiched between first slit portion 3C and one of the pair of second slit portions 3A, 3B. Stated differently, the pair of beam portions 1P1, 1P2 are disposed, sandwiching a standing substrate 2. Beam portions 1P1, 1P2 are portions of parent substrate 1 that extend rightward in FIG. 29 from points that have the same coordinate as the end 8a in the left-right direction of the figure as the starting points.

As with the other embodiments, standing substrate electrodes 6 are formed on support 4. Parent substrate electrodes 5 are formed on beam portions 1P1, 1P2 of parent substrate 1. In other words, parent substrate electrodes 5 are formed on the other first primary surface 1b of beam portions 1P1, 1P2. A parent substrate electrode 5 formed on beam portion 1P1 and a standing substrate electrode 6 on support 4 inserted in first slit portion 3C are bonded by solder 10. Parent substrate electrode 5 formed on beam portion 1P2 and standing substrate electrode 6 on support 4 inserted in first slit portion 3C are bonded by solder 10. Accordingly, parent substrate electrode 5 formed on one of the pair of beam portions 1P of parent substrate 1 and standing substrate electrode 6 on support 4 inserted in first slit portion 3C are bonded by solder 10. Solder 10 is bonded by flow soldering, for example. Note that, preferably, parent substrate electrode 5 is formed in regions of beam portions 1P1, 1P2 closer to the heads of beam portions 1P1, 1P2 in the left-right direction of the figure, that is, regions farther away from end 8a.

Figure 30:
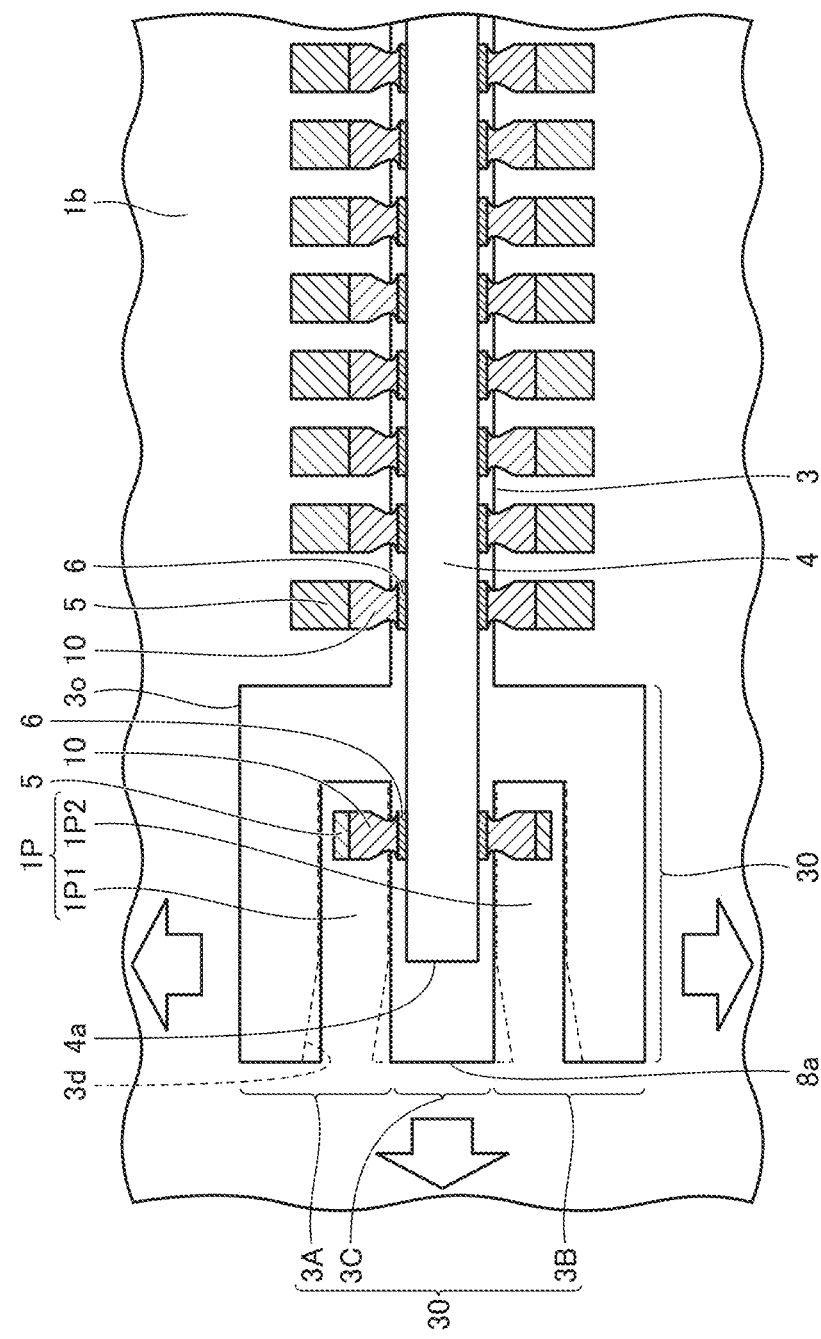
FIG. 30 is a schematic plan view for illustrating effects of the first example according to Embodiment 5, showing the slit when a parent substrate has expanded.

FIG. 30 is a schematic plan view for illustrating effects of the first example of Embodiment 5, showing the slit when the parent substrate has expanded. Referring to FIG. 30, the three-dimensional printed wiring board expands due to a temperature change in use environment. Due to this, the slit is to deform as indicated by the arrows in the figure, from initial slit shape 3o to expanded slit shape 3d indicated by the dotted line. At this time, a stress is applied to parent substrate 1 and standing substrate 2 in a direction in which the joint by solder 10 between parent substrate electrode 5 and standing substrate electrode 6 is peeled off.

As with FIG. 12, etc., an amount of expansion of slit 3 in the width direction is maximum at end 8a of slit 3. In other words, the stress illustrated in FIG. 30 is maximum at end 8a of slit 3. However, in the present embodiment, slit 3 has the pair of cantilever beam portions 1P sandwiching and supporting standing substrate 2, including support 4. Therefore, even in the event of the expansion of parent substrate 1 as illustrated in FIG. 30, the energy of the expansion is absorbed by beam portions 1P deflexing. Accordingly, the stress applied to the joint, by solder 10, between parent substrate electrode 5 and standing substrate electrode 6 can be reduced. As with Embodiment 1, this can reduce the strain at the joint by solder 10 and extend the lifetime of the solder joint.

Figure 31:
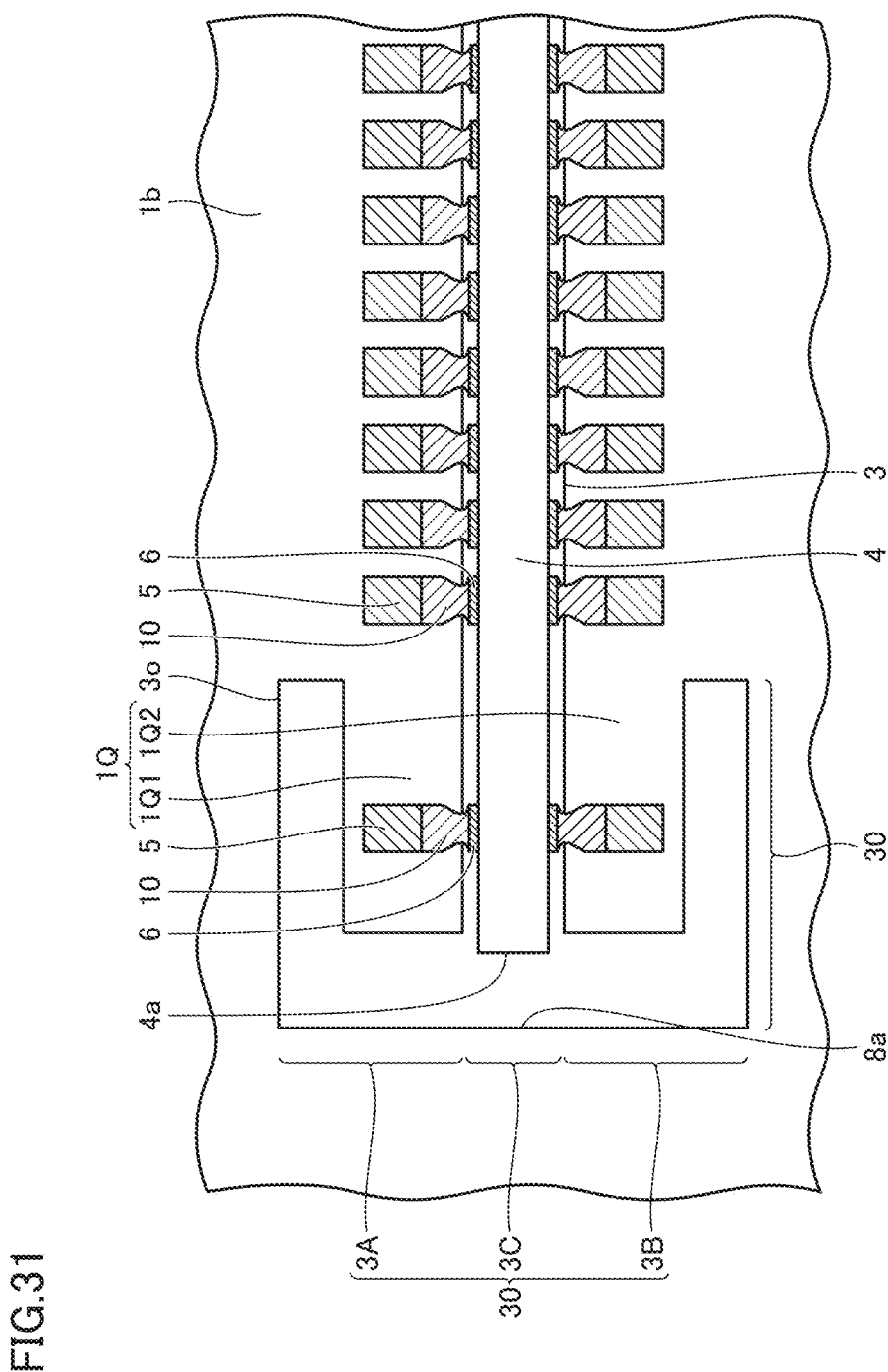
FIG. 31 is a schematic plan view showing a slit having a support inserted and solder bonded thereto, according to a second example of Embodiment 5.

FIG. 31 is a schematic plan view showing the slit having the support inserted and solder bonded thereto, according to a second example of Embodiment 5. Referring to FIG. 31, the three-dimensional printed wiring board according to the second example of the present embodiment has a configuration that is broadly the same as the first example illustrated in FIG. 29. Therefore, the same reference signs as the first example refer to the same components in the second example and the description thereof will not be repeated. However, the points at which slit 3 branches into first slit portion 3C and the pair of second slit portions 3A, 3B in end-contiguous region 30 in FIG. 31 are different from the first example. Specifically, in FIG. 31, slit 3 branches at the far end 8a of end-contiguous region 30. In this respect, FIG. 31 is different in configuration from FIG. 29 in which slit 3 branches at points farthest away from end 8a in end-contiguous region 30.

In FIG. 31, slit 3 branches into first slit portion 3C and the pair of second slit portions 3A, 3B from a portion of end-contiguous region 30, the portion including end 8a and extending in the top-bottom direction of the figure. Slit 3 branches into second slit portion 3A above the first slit portion 3C and into second slit portion 3B below the first slit portion 3C. Second slit portions 3A, 3B extend along the longitudinal direction of support 4 and slit 3 from the branch points to the side opposite the end 8a (the right side).

This forms spacing between first slit portion 3C and second slit portion 3A and between first slit portion 3C and second slit portion 3B in the top-bottom direction. These spacing's are formed as the pair beam portions 1Q of parent substrate 1. Specifically, beam portion 1Q1 is formed, sandwiched between first slit portion 3C and second slit portion 3A. Beam portions 1Q2 is formed, sandwiched between first slit portion 3C and second slit portion 3B. Beam portions 1Q1, 1Q2 are portions of parent substrate 1 that extend leftward in FIG. 31 from points that have the same coordinate as a point that is farthest away from end 8a in the left-right direction in end-contiguous region 30. In other words, in FIG. 31, as the other first primary surface 1b, beam portions 1Q1, 1Q2 continue with the region on the right side that is not a beam portion. Parent substrate electrodes 5 formed on beam portions 1Q1, 1Q2 and standing substrates electrode 6 on support 4 inserted in first slit portion 3C are bonded by solder 10. Note that beam portions 1Q1, 1Q2 each have one parent substrate electrode 5 formed thereon in FIG. 31.

As described above, the configuration illustrated in FIG. 31 is the same as the configuration illustrated in FIG. 29, except for the point of branch of slit 3 and the direction in which slit 3 branches. Therefore, the configuration illustrated in FIG. 31, basically, yields the same effects as the configuration illustrated in FIG. 29.

Figure 32:
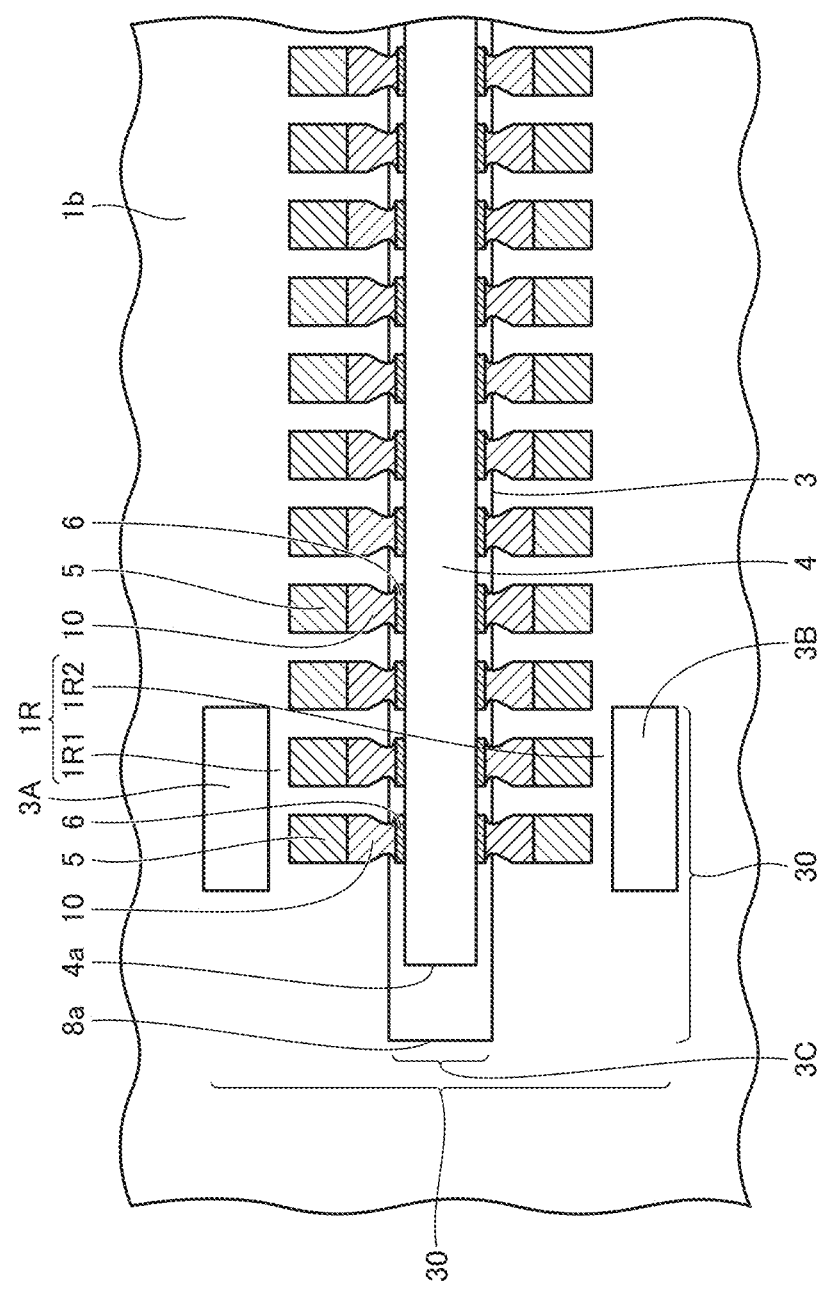
FIG. 32 is a schematic plan view showing a slit having a support inserted and solder bonded thereto, according to a third example of Embodiment 5.

FIG. 32 is a schematic plan view showing a slit having a support inserted and solder bonded thereto, according to a third example of Embodiment 5. Referring to FIG. 32, a three-dimensional printed wiring board according to the third example of the present embodiment has a configuration that is broadly the same as the first example illustrated in FIG. 29 and the second example illustrated in FIG. 31. Therefore, the same reference signs as the first example and the second example refer to the same components in the third example and the description thereof will not be repeated. In the third example illustrated in FIG. 32, second slit portions 3A, 3B of end-contiguous region 30 in FIGS. 29 and 31 each only have a portion that extends in the left-right direction of the figure, that is, the longitudinal direction. Second slit portions 3A, 3B of FIG. 32 each have no portion that branches off from first slit portion 3C and extends in the top-bottom direction of the figure.

In other words, in FIG. 32, slit 3 is formed to include first slit portion 3C and the pair of second slit portions 3A, 3B in a region of the three-dimensional printed wiring board adjacent to end 8a in the longitudinal direction of slit 3. Support 4 is inserted in first slit portion 3C. The pair of second slit portions 3A, 3B are formed, spaced apart from each other in the top-bottom direction intersecting with the longitudinal direction of first slit portion 3C, and longitudinally extend. A pair of sandwiched portions 1R of parent substrate 1 are formed so as to be sandwiched between first slit portion 3C and one of the pair of second slit portions 3A, 3B. Here, sandwiched portion 1R includes a sandwiched portion 1R1 that is sandwiched between first slit portion 3C and second slit portion 3A, and a sandwiched portion 1R2 that is sandwiched between first slit portion 3C and second slit portion 3B. Sandwiched portion 1R is a member corresponding to beam portions 1P, 1Q in the above-described examples. Therefore, parent substrate electrodes 5 are formed on the surfaces of sandwiched portions 1R1, 1R2. Parent substrate electrodes 5, formed on one of the pair of sandwiched portions 1R1, 1R2 of parent substrate 1, and standing substrate electrodes 6 on support 4 inserted in first slit portion 3C are bonded by solder 10. Note that one parent substrate electrode 5 may be formed on each of sandwiched substrates 1R1, 1R2, and two or more parent substrate electrodes 5 may be formed thereon.

As described above, the configuration illustrated in FIG. 32 is the same as the configurations illustrated in FIG. 29, 31, except for slit 3 being divided to be discontinuous, rather than branching up and down from the middle of slit 3. Therefore, the configuration illustrated in FIG. 32 basically, yields the same effects as the configurations illustrated in FIGS. 29, 31.

Figure 33:
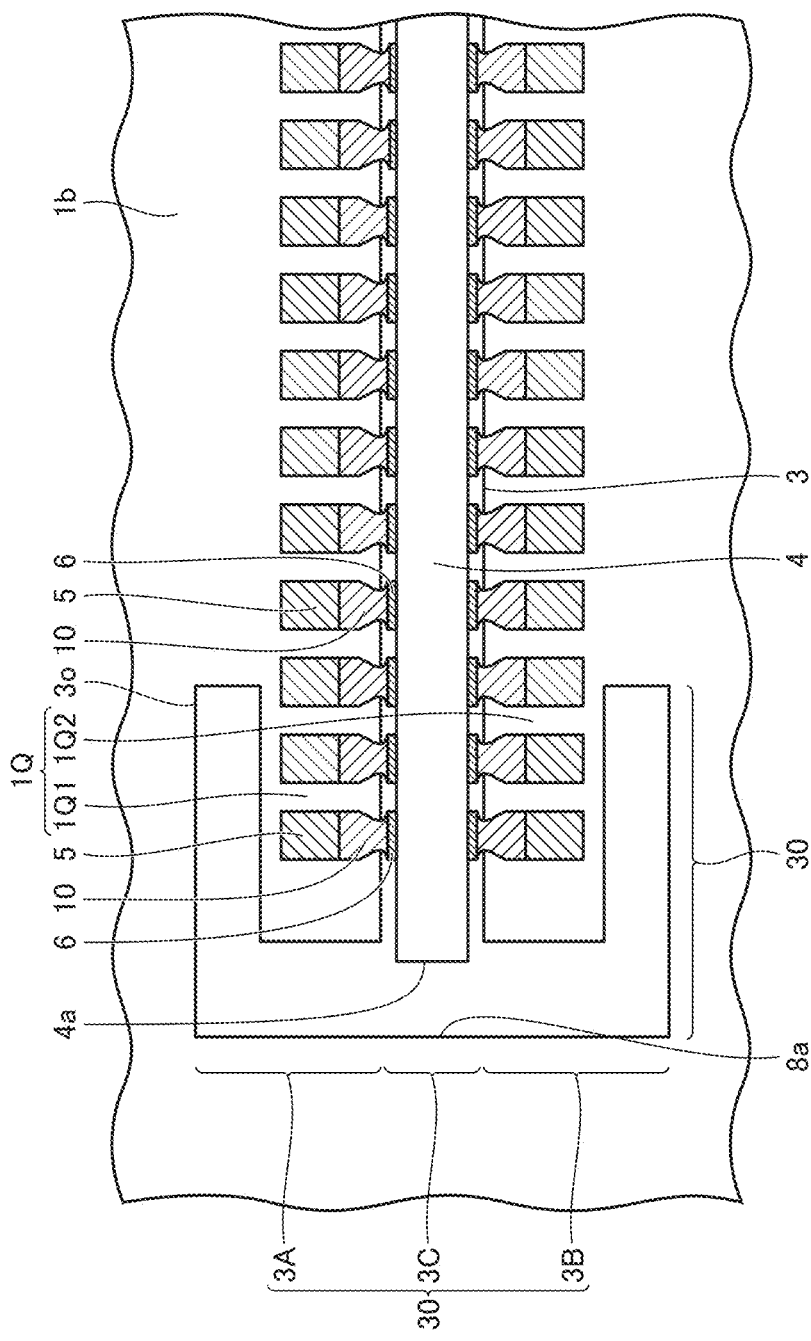
FIG. 33 is a schematic plan view showing the slit having the support inserted and solder bonded thereto, according to a further variation of the second example of Embodiment 5 of FIG. 31.

FIG. 33 is a schematic plan view showing the slit having the support inserted and solder bonded thereto, according to a variation of the second example of Embodiment 5 of FIG. 31. Referring to FIG. 33, the three-dimensional printed wiring board according to the variation of the second example of the present embodiment has a configuration that is broadly the same as the second example illustrated in FIG. 31. Therefore, the same reference signs as the second example refer to the same components in the variation and the description thereof will not be repeated.

In the variation illustrated in FIG. 33, multiple parent substrate electrodes 5 are formed on each of beam portions 1Q1, 1Q2 as with the region of the three-dimensional printed wiring board on the right side of end-contiguous region 30 in FIG. 33, and the parent substrate electrodes 5 are respectively bonded to standing substrate electrodes 6 by solder 10. In other words, in FIG. 33, multiple parent substrate electrodes 5 may be aligned, equally spaced apart from each other in the longitudinal direction from beam portions 1Q1, 1Q2 to the other first primary surface 1b continued from and outside the beam portions 1Q1, 1Q2. Alternatively, multiple parent substrate electrodes 5 that are longitudinally aligned on beam portions 1Q1, 1Q2 and multiple parent substrate electrodes 5 that are longitudinally aligned outside the beam portions 1Q1, 1Q2 may be differently spaced apart from each other. In FIG. 33, they are equally spaced apart from each other. In the above respect, the configuration illustrated in FIG. 33 is different from the configuration illustrated in FIG. 31 in which one parent substrate electrode 5 is formed on each of beam portions 1Q1, 1Q2.

Figure 34:
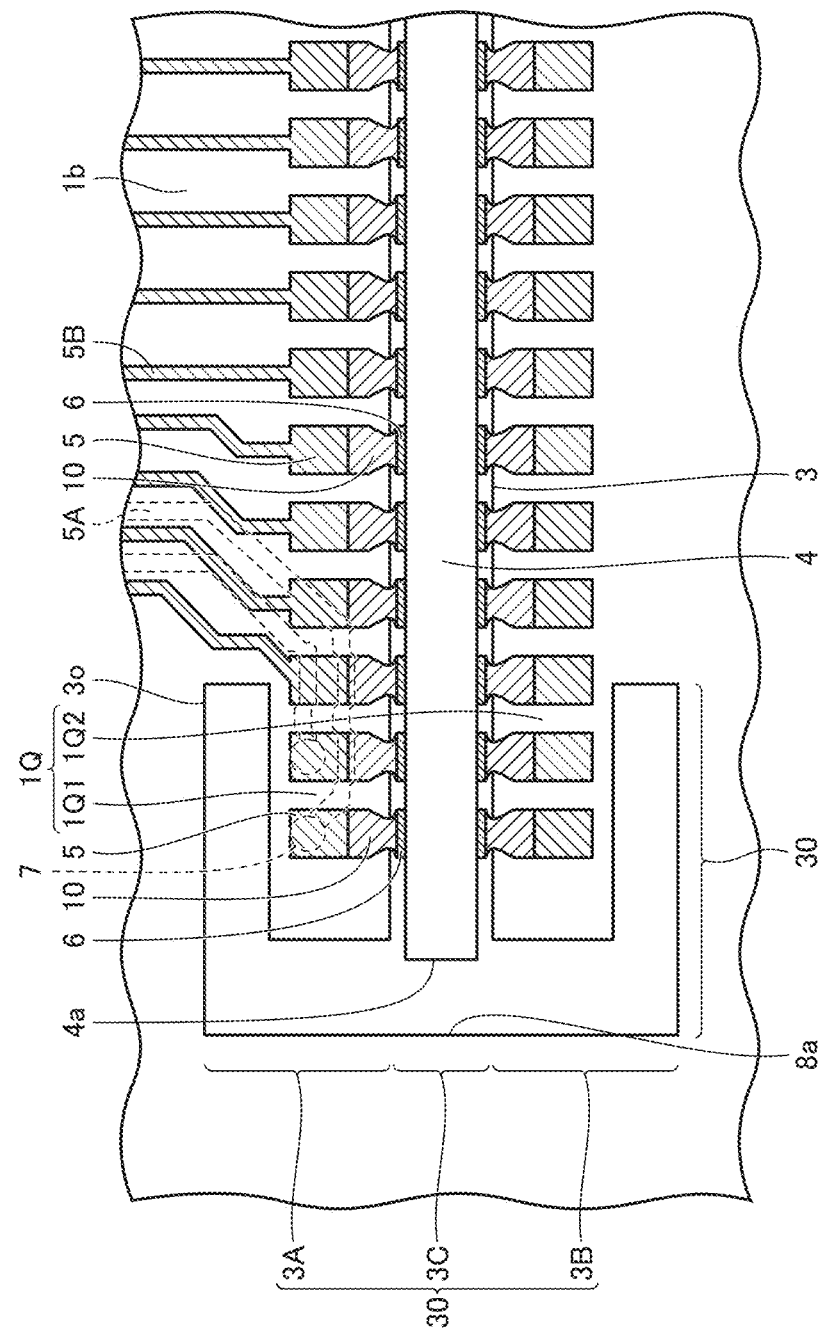
FIG. 34 is a schematic plan view of the three-dimensional printed wiring board for illustrating effects of the configuration illustrated in FIG. 33.
Figure 35:
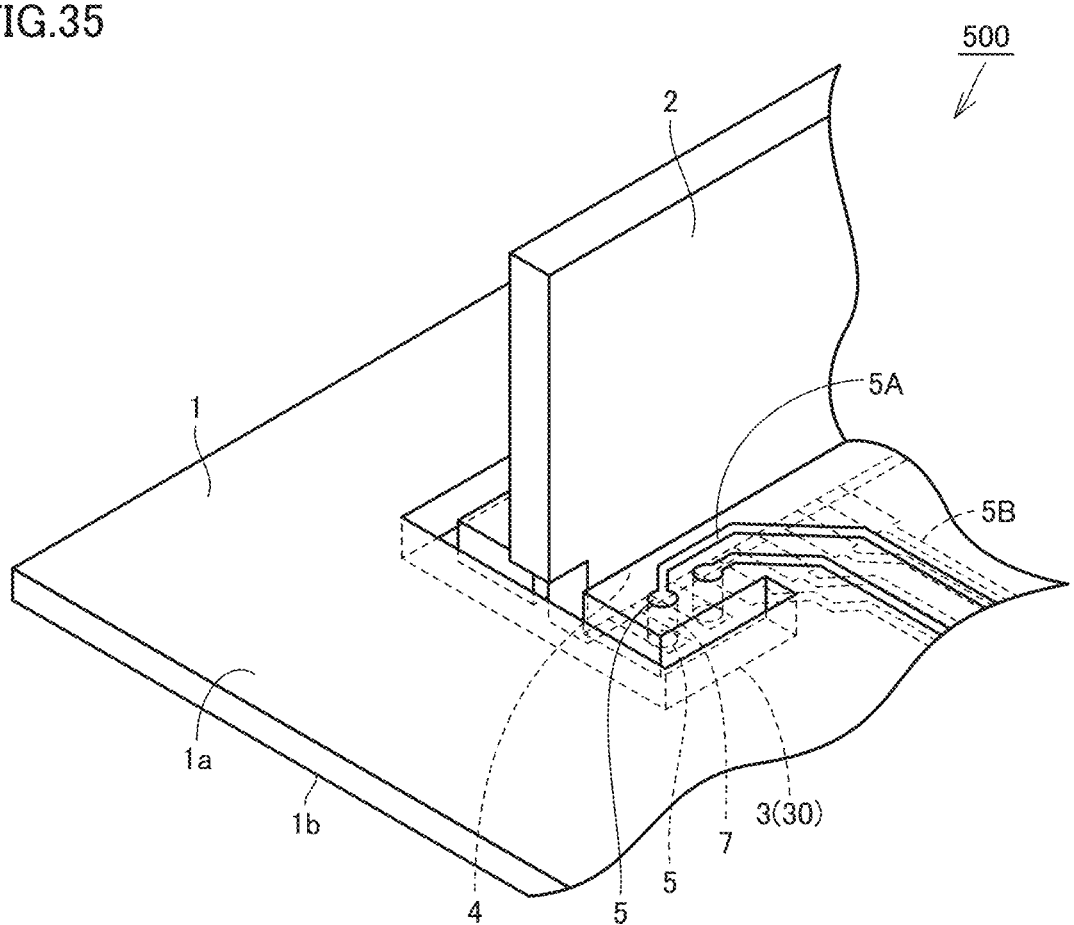
FIG. 35 is a schematic perspective view of a portion of the three-dimensional printed wiring board having the configuration of FIG. 34, for illustrating effects of the configuration illustrated in FIG. 33.

FIG. 34 is a schematic plan view of the three-dimensional printed wiring board for illustrating effects of the configuration illustrated in FIG. 33. FIG. 35 is a schematic perspective view of a portion of the three-dimensional printed wiring board having the configuration of FIG. 34, for illustrating effects of the configuration illustrated in FIG. 33. Referring to FIG. 34, forming multiple parent substrate electrodes 5 on each of beam portions 1Q1, 1Q2 as illustrated in FIG. 33, in contrast to FIG. 31, yields additional effects described in the following. Referring to FIGS. 34 and 35, when connecting lines to a relatively narrow beam portion 1Q surrounded by slit 3, if all the lines are drawn out from parent substrate electrodes 5 on the other first primary surface 1b, the interconnect density is excessively high, which may result in a failure, such as short circuit.

According to the configurations of FIGS. 33 to 35, throughholes 7 can be formed, extending, passing through parent substrate 1 in the direction of thickness, starting from parent substrate electrodes 5 on the other first primary surface 1b onto the one first primary surface 1a. Parent substrate electrodes 5 on the other first primary surface 1b can be routed onto the one first primary surface 1a via these throughholes 7. Therefore, as shown in FIGS. 34 and 35, the lines connected to parent substrate electrodes 5 on the other first primary surface 1b can be distributed to lines 5A on the one first primary surface 1a and lines 5B on the other first primary surface 1b. Therefore, the number of lines connectable to the three-dimensional printed wiring board 500 can be doubled, while ensuring the reliability. Accordingly, more dense interconnect is possible. However, for example, the same thoroughholes 7 as FIGS. 34 to 35 may be formed in the examples illustrated in FIGS. 29 to 31.

The features of the embodiments described above (and the examples included therein) may be applied to be combined, as appropriate, to the extent they are technically consistent herewith.

The presently disclosed embodiments should be considered in all aspects illustrative and not restrictive. The scope of the present disclosure is indicated by the appended claims, rather than by the description above, and all changes that come within the scope of the claims and the meaning and range of equivalency of the claims are intended to be embraced within their scope.

REFERENCE SIGNS LIST 1 parent substrate; 1a one first primary surface; 1b other first primary surface; 1P, 1P1, 1P2, 1Q, 1Q1, 1Q2 beam portion; 1R, 1R1, 1R2 sandwiched portion; 2 standing substrate; 2a one second primary surface; 2b other second primary surface; 3 slit; 3a, 8a end; 3d, 3dd expanded slit shape; 3i comparative shape; 3o initial slit shape; 3R relieved portion; 4 support; 5 parent substrate electrode; 6 standing substrate electrode; 7 thoroughhole; 8, 12 slit gap; 9 spacer; 10 solder; 13 bridge; 14 coupled slit gap; 30 end-contiguous region; and 100, 200 three-dimensional printed wiring board.

The invention claimed is:

1. A printed wiring board, comprising:
   a first substrate which has a slit and includes at least one first electrode, the slit being formed in the first substrate and passing through the first substrate from one first primary surface to an other first primary surface opposite the one first primary surface; and
   a second substrate having one second primary surface and an other second primary surface opposite the one second primary surface, the second substrate including (i) a support inserted in the slit so as to intersect with the first substrate and (ii) at least one second electrode on the support, the first electrode on the first substrate and the second electrode being bonded by a solder, wherein
   a dimension of the slit in a longitudinal direction is greater than a sum of a design dimension of the support in a longitudinal direction, a maximum design dimension tolerance of the support in the longitudinal direction, and a maximum design dimension tolerance of the slit in the longitudinal direction,
   a first slit gap is formed between an end of the support in the longitudinal direction and an end of the slit in the longitudinal direction,
   a first width of the first slit gap of the slit is less than a second width, the first width being a width of the first slit gap in a direction intersecting with the longitudinal direction of the slit, the second width being a width of a region of the slit, other than the first slit gap,
   the first width is less than a substrate thickness which is spacing between the one second primary surface and the other second primary surface of the second substrate,
   a plurality of slits comprising the slit are formed in the first substrate, spaced apart from each other in a longitudinal direction of the first substrate,
   a plurality of supports comprising the support are formed on the second substrate, spaced apart from each other in the longitudinal direction of the second substrate, and
   a second slit gap having the first width is formed between a pair of slits adjacent to each other among the plurality of slits, the second slit gap connecting the pair of slits.

2. The printed wiring board according to claim 1, wherein a first slit gap is formed between an end of the support in the longitudinal direction and an end of the slit in the longitudinal direction, and
   the first slit gap in the longitudinal direction of the support and the slit has a length of 0.65 mm or greater.

3. The printed wiring board according to claim 1, wherein in a region of the printed wiring board adjacent to an end of the slit in the longitudinal direction, the slit branches into a first slit portion in which the support is inserted, and a pair of second slit portions extending in the longitudinal direction of the slit and spaced apart from each other in a direction intersecting with a longitudinal direction of the first slit portion,
   a pair of beam portions of the first substrate are formed, sandwiched between the first slit portion and one of the pair of second slit portions and between the first slit portion and an other of the pair of second slit portions, and
   the first electrode formed on any one of the pair of beam portions of the first substrate and the second electrode on the support inserted in the first slit portion are bonded by a solder.

4. The printed wiring board according to claim 1, wherein in a region of the printed wiring board adjacent to an end of the slit in the longitudinal direction, the slit is formed to include a first slit portion in which the support is inserted, and a pair of second slit portions formed spaced apart from each other in a direction intersecting with a longitudinal direction of the first slit portion and extending in the longitudinal direction of the slit,
   a pair of sandwiched portions of the first substrate are formed, sandwiched between the first slit portion and one of the pair of second slit portions and between the first slit portion and an other of the pair of second slit portions, and
   the first electrode formed on any one of the pair of sandwiched portions of the first substrate and the second electrode on the support inserted in the first slit portion are bonded by a solder.

5. The printed wiring board according to claim 1, wherein a plurality of slits comprising the slit are formed in the first substrate, spaced apart from each other in a longitudinal direction of the first substrate, and
   a plurality of supports comprising the support are formed on the second substrate, spaced apart from each other in the longitudinal direction of the second substrate.

6. A printed wiring board, comprising:
   a first substrate which has a slit and includes at least one first electrode, the slit being formed in the first substrate and passing through the first substrate from one first primary surface to an other first primary surface opposite the one first primary surface; and
   a second substrate having one second primary surface and an other second primary surface opposite the one second primary surface, the second substrate including (i) a support inserted in the slit so as to intersect with the first substrate and (ii) at least one second electrode on the support, the first electrode on the first substrate and the second electrode being bonded by a solder, wherein
   a dimension of the slit in a longitudinal direction is greater than a sum of a design dimension of the support in a longitudinal direction, a maximum design dimension tolerance of the support in the longitudinal direction, and a maximum design dimension tolerance of the slit in the longitudinal direction,
   a first slit gap is formed between an end of the support in the longitudinal direction and an end of the slit in the longitudinal direction,
   a first width of the first slit gap of the slit is less than a second width, the first width being a width of the first slit gap in a direction intersecting with the longitudinal direction of the slit, the second width being a width of a region of the slit, other than the first slit gap,
   the first width is less than a substrate thickness which is spacing between the one second primary surface and the other second primary surface of the second substrate, and the longitudinal length of the first slit gap is longer than the longitudinal length of the region of the second substrate, other than the support inserted in the slit.

7. A printed wiring board, comprising:

a first substrate which has a slit and includes at least one first electrode, the slit being formed in the first substrate and passing through the first substrate from one first primary surface to an other first primary surface opposite the one first primary surface; and a second substrate having one second primary surface and an other second primary surface opposite the one second primary surface, the second substrate including (i) a support inserted in the slit so as to intersect with the first substrate and (ii) at least one second electrode on the support, the first electrode on the first substrate and the second electrode being bonded by a solder, wherein a dimension of the slit in a longitudinal direction is greater than a sum of a design dimension of the support in a longitudinal direction, a maximum design dimension tolerance of the support in the longitudinal direction, and a maximum design dimension tolerance of the slit in the longitudinal direction, a first slit gap is formed between an end of the support in the longitudinal direction and an end of the slit in the longitudinal direction, a plurality of slits comprising the slit are formed in the first substrate, spaced apart from each other in a longitudinal direction of the first substrate, and a second slit gap is formed between a pair of slits adjacent to each other among the plurality of slits, the second slit gap connecting the pair of slits.

\* \* \* \* \*